(12) United States Patent
Usenko

(10) Patent No.: US 7,148,124 B1
(45) Date of Patent: Dec. 12, 2006

(54) METHOD FOR FORMING A FRAGILE LAYER INSIDE OF A SINGLE CRYSTALLINE SUBSTRATE PREFERABLY FOR MAKING SILICON-ON-INSULATOR WAFERS

(76) Inventor: Alexander Yuri Usenko, 20 Southgate Rd. #2, Murray Hill, NJ (US) 07974

( * ) Notice: Subject to any disclaimer, the term of this patent is extended or adjusted under 35 U.S.C. 154(b) by 216 days.

(21) Appl. No.: 10/991,919

(22) Filed: Nov. 18, 2004

(51) Int. Cl.
 *H01L 21/76* (2006.01)
(52) U.S. Cl. ............................... 438/458; 257/E21.568
(58) Field of Classification Search ............... 438/458; 257/E21.568
See application file for complete search history.

(56) References Cited

U.S. PATENT DOCUMENTS

| | | | |
|---|---|---|---|
| 5,374,564 | A | 12/1994 | Bruel |
| 5,877,070 | A * | 3/1999 | Goesele et al. ............. 438/458 |
| 5,994,207 | A | 11/1999 | Henley |
| 6,150,239 | A * | 11/2000 | Goesele et al. ............. 438/458 |
| 6,352,909 | B1 | 3/2002 | Usenko |
| 6,812,547 | B1 | 11/2004 | Bower |

OTHER PUBLICATIONS

Y.V. Nastaushev, et al. "20-nm Resolution of electron lithography for the nano-devices on ultrathin SOI film" Materials Science and Engineering C vol. 19 (2002) 189-192.

Z. Fan, P.K. Chu, et.al Thickness uniformity of silicon-on-insulator fabricated by plasma Immersion ion Implantation and ion cut, IEEE Trans. on Plasma Sci.27, 1999, p. 633-636.

A. Agarwal et al., "Efficient production of silicon-on-insulator films by co-implantation of He+ with H+", Applied Physics Letters, vol. 72 (1998), pp. 1086-1088.

J. K. Lee, et al., "Role of Boron for Defect Evolution in Hydrogen-Implanted Silicon", Applied Physics Letters, vol. 83, (2003), pp. 3042-3044.

* cited by examiner

*Primary Examiner*—Asok Kumar Sarkar

(57) ABSTRACT

Process for forming a fragile layer inside of a single crystalline substrate near one of the substrate surfaces. The fragile layer is created by collecting hydrogen in high concentration at a desired depth. The hydrogen layer is collected on a seed layer. The seed layer is formed by ion implantation of non-doping species and annealing. The implantation introduces defects that are capable to trap hydrogen, and annealing confines the seed layer making it flat and thin. Then protium hydrogen ions are implanted at elevated temperature. The protium implantation depth is bigger than the depth of the seed layer. The implanted protium moves to the seed layer and trap there. The process is useful for making silicon-on-insulator (SOI) wafers. SOI with an ultrathin superficial silicon layer of high quality can be obtained. Hydrogen can be implanted at high dose rate, and thus the SOI wafers can be manufactured with high throughput and low cost. SOI wafers also have high quality as superficial silicon does not contain microvoids.

13 Claims, 11 Drawing Sheets

METHOD FOR FORMING A FRAGILE LAYER INSIDE OF A SINGLE CRYSTALLINE SUBSTRATE PREFERABLY FOR MAKING SILICON-ON-INSULATOR WAFERS

FIELD OF THE INVENTION

The present invention relates generally to a fabrication of silicon-on-insulator (SOI) wafers. More particularly the present invention relates to a cost efficient process of making a fragile plane inside of a single crystalline silicon wafer at shallow depth under the wafer surface.

BACKGROUND OF THE INVENTION

Silicon-on-insulator (SOI) wafer is a starting material for making advanced semiconductor chips. Currently the most advanced method of making the SOI wafers is a layer transfer method. In the layer transfer method, a thin film of crystalline material is delaminated from a first wafer and laminated on a surface of a second wafer. The first wafer is called a donor wafer, and the second one is called a destination wafer. Either the donor or the destination wafer or both can have insulating films on their surfaces. Those insulator films further appear as a middle layer in a 3-layer sandwich structure that is obtained by the layer transfer process. The sandwich structure which consists of a silicon wafer with silicon dioxide and silicon films on its top is referred as the SOI wafer, and it is mostly used in mass production of advanced chips. The layer transfer process was invented by Bruel, and described in U.S. Pat. No. 5,374,564 awarded to him. Bruel's process was later named Smart-Cut. The Smart-Cut process sequence is schematically illustrated on FIG. 1 and FIG. 2. Due to the Smart-Cut process, FIG. 1A an initial donor wafer 101 with a silicon dioxide layer 102 is provided. Then, FIG. 1B, the wafer 101 is implanted through oxide 102 with hydrogen ions 103 which stops inside of silicon wafer and form a hydrogen-rich layer 104. The layer 104 divides the wafer 101 into silicon film 105 to be further transferred and a leftover part 106. Then, FIG. 1C the donor wafer 101 is brought into contact with a destination wafer 107 and a prebonded wafer assembly 108 with bonding interface 109 is formed. Then, FIG. 1D the assembly 108 is heated to cause a spontaneous cleavage along the hydrogen-rich layer 104 and make a SOI wafer 109 and a leftover wafer 110. The SOI wafer 109 consists of a silicon wafer 107 covered with a silicon dioxide film 111 and a single crystalline silicon film 112 having a work side surface 113. More processing details 201–208 of the Smart-Cut are illustrated by FIG. 2.

The Smart-Cut process still has drawbacks that where partially eliminated by numerical improvements as described in patents awarded to Goesele—U.S. Pat. No. 6,150,239, to Henley—U.S. Pat. No. 5,994,207, to Usenko—U.S. Pat. No. 6,352,909, and in others. The most important drawbacks of the Smart-Cut are as follows:
(1) difficult to get thin transferred layer;
(2) high manufacturing cost.

The difficulty in the transfer of thinner layers in the Smart-Cut is caused by the use of hydrogen implantation into plain silicon lattice. In the Smart-Cut, hydrogen implantation depth defines a plane along which a film is further delaminated from the donor wafer. Hydrogen is the lightest ion; therefore it penetrates into targets deeper than any other ion being implanted. At typical hydrogen ion energy of about 100 keV used in the Smart-Cut process, the hydrogen penetrates to a depth of about 1 micrometer below the silicon surface. And, about 1-micron thick layer is delaminated from a donor substrate and laminated to a destination substrate. The typical final Unibond™ wafer (SOI wafer obtained by Smart-Cut process) therefore has about 1-micron thick superficial silicon, or about 1-micron thick stacks consisting of the superficial silicon, and an insulative film. Chip manufacturing, however, requires much thinner superficial silicon, and insulator layer thicknesses. Manufacturing of mainstream chips that have fully depleted CMOS architecture requires the thickness to be no more than 50 nanometers. In the future, manufacturing chips will require even thinner silicon layers as the chipmaking advances mainly by scaling down all features, including the lateral and vertical dimensions of transistors constituting the chips. Smart-cut however, is limited to layer transfers in excess of 200 nm. There were attempts to obtain thinner layers by the Smart-Cut by lowering of hydrogen implantation energy. Bruel's patent does not claim hydrogen energy range, but later it was found that the lowest energy is about 20 keV [Y. V. Nastaushev, T. Gavrilova, M. Kachanova, L. Nenasheva, V. Kolosanov, O. V. Naumova, V. P. Popov, A. L. Aseev "20-nm Resolution of electron lithography for the nano-devices on ultrathin SOI film" Materials Science and Engineering C vol. 19 (2002) 189–192]. At lower energies, Smart-Cut process fails. In the case of low implantation energy, implanted hydrogen does not form an in-depth distribution with a clear peak at some depth. Instead, hydrogen is distributed quite evenly from surface to some depth in silicon. When there is no a well defined peak, the donor wafer is either not cleavable, or it cleaves at various depths along the wafer area, and a layer that is highly non-uniform in thickness is further delaminated and transferred onto a destination wafer. The relative widening of the peak of the implanted specie with energy decrease is a general feature of ion implantation that relates to all kinds of implanted ions. At higher energies, ions show an average depth where they stop (called projection range) that is much bigger, than average depth deviation (called struggle). At low energies, the struggle is approaching ½ of the projection range, and therefore the ion distribution looses peak pattern with energy lowering. High energy (tens of keV or more) ions predominantly loose their energy while penetrating a target by transferring energy to electrons of the target. When ion energy drops to about 20 keV, another mechanism of interaction with a target becomes dominant. The mechanism is displacing of target atoms. Therefore at the end of its track, ion makes numerical displacements of target lattice atoms and quickly stops. This results in quite narrow peak of distribution of high energy ions. Implanting of sub-20-keV ions predominantly results in displacing of target lattice atoms beginning from initial hit into the lattice; in other words, the low energy ion begins to destroy target lattice as soon as it hits the crystal surface. Therefore sub-20-keV implanting results in in-depth profile of implanted ions that is rather diffused, then a peak-like. The diffused profile causes the Smart-Cur failure.

Another reason why Smart-Cut fails to transfer thin films relates to surface damage by sub-20 keV ions. The damaged surface has higher roughness then an initial polished surface. Rough surface donor cannot be bonded to the destination wafer. Without bonding, the layer cannot be transferred, and Smart-Cut fails.

Another cause why Smart-Cut fails to transfer thin films is a premature blistering of wafer surface if the wafer is implanted with low energy ions. Hydrogen implantation results in creating of pressurized hydrogen bubbles under wafer surface. Low energy implantation results in shallow location of the bubbles. Thinner layer of silicon covering the bubbles is easier to break. The wafers implanted with sub-20 keV hydrogen ions blister at implantation doses that are lower than a dose needed for layer transfer.

Attempts to obtain thin superficial silicon by transferring of 200-nm Si—SiO$_2$ stacks mostly consisting from SiO$_2$ (like 50 nm of Si and 150 nm of SiO$_2$) also fails. In this case implanted hydrogen segregates at Si—SiO$_2$ interface instead of forming a cleavage plane inside of silicon. Only SiO$_2$ layer transfers are obtained, and SOI wafers are not obtained.

Additional thinning of transferred films by polishing or etching is typically used to extend the Smart-Cut capabilities into sub-100 nm range. Thinning however increases thickness non-uniformity of the superficial crystalline film of SOI wafer that is highly undesirable.

High manufacturing costs of the Smart-Cut are caused by necessity of prolonged hydrogen implanting. Smart-Cut requires implanting of hydrogen in a dose exceeding $4 \times 10^{16}$ cm$^{-2}$. Even though this dose is two orders of magnitude bigger, than doses used in chip manufacturing, modern implanters allow getting reasonably high throughput for this dose as they have high ion beam current. Hydrogen implantation in Smart-Cut cannot however benefit from high ion beam current. The higher the beam current, the stronger is target heating. If the target (i.e, silicon wafer) is heated over about 80° C. during the implantation, Smart-Cut fails. Heating of the wafer under implantation causes premature blistering. Due to its low solubility in silicon, implanted hydrogen immediately segregates into pressurized bubbles. At elevated temperature the bubbles develop high pressure and cause fracture of silicon film covering the bubble. FIG. 3 shows a typical picture of wafer that is implanted at high beam current. On FIG. 3, areas 301 are not blistered, while areas 302 are blistered. In this case, the blistered areas are closer to the wafer center which had worse contact to a thermal sink and was heated to higher temperature.

To obtain higher throughput of Smart-Cut implantation, cooling of the silicon wafer during the Smart-Cut implantation is typically used. The cooling, however, allows increasing the hydrogen ion beam current no more then by a factor of 2 or 3. It means that the implantation time for one wafer can be decreased from several hours per wafer to about one hour per wafer that is very low throughput in wafer production. Batch implanters process up to about a dozen wafers simultaneously. Those implanters allow increasing the throughput by about a factor equal to a number of the simultaneously processed wafers. Therefore the best achievable throughput in the Smart-Cut is limited to about 10 wph (wafers per hour). This is not enough to achieve a cost-efficient SOI wafer production.

To obtain higher throughput of Smart-Cut implantation, plasma immersion ion implantation was suggested. Henley in U.S. Pat. No. 6,582,999 as well as in his previous 20 related patents (U.S. Pat. Nos. 6,548,382, 6,528,391, 6,511,899, 6,458,672, 6,413,837, 6,321,134, 6,291,326, 6,291,314, 6,290,804, 6,248,649, 6,207,005, 6,162,705, 6,155,909, 6,153,524, 6,146,979, 6,083,324, 6,013,563, 6,010,579, 5,994,207, 5,985,742) describes using of plasma immersion ion implantation instead of conventional beam implantation to introduce hydrogen into silicon to a defined plane for further cleavage and SOI wafer production. The plasma immersion ion implantation is similar to the regular implantation in many considerations. The plasma immersion equipment can be described as a simplified ion implanter: a regular implanter but not equipped with ion separator.

Another important feature of the plasma immersion ion implantation is that it is pulsed. In a wafer being implanted, all vacancies and interstitials are generated during the pulse, and therefore, it results in denser concentration of vacancies, and interstitials at the end of the pulse as compared to the steady state defect generation. The denser concentration of the generated defects causes more efficient annihilation of the defects. Finally, in the Smart-Cut at room temperature, about 50% of hydrogen find a vacancy, form a hydrogen-vacancy site, and retain in the silicon, while less then 10% of hydrogen introduces by plasma immersion ion implantation find a vacancy and retain in silicon. However, the plasma immersion ion implantation has an advantage over the beam implantation as it allows obtaining much higher hydrogen fluences. The beam implantation is limited to no more then about 0.1 A hydrogen ion beam current, while plasma immersion ion implantation can yield up to 10 A in averaged hydrogen current into the wafer. Therefore, the plasma immersion ion implantation can potentially give better wafer throughput, than the beam implantation, even though the hydrogen losses are much higher in the plasma immersion case. The direct replacement of the beam implantation by plasma immersion in the Smart-Cut results, however, in much worse quality of final SOI wafers. The reason is that in the plasma immersion case, hydrogen having energies from almost zero to about 40 keV is implanted. That results in hydrogen retention in wide layer from surface to about 0.5 micrometer. Immediately after implantation, hydrogen is in form of bubbles in silicon. High temperature anneal after cleavage removes hydrogen from silicon leaving empty voids in place of hydrogen bubbles. A crystalline quality of that heavily hydrogenated silicon cannot be healed by annealing to a level required by chip production.

Henley does not describe in his patents, what is the minimum hydrogen dose needed to enable the layer transfer with plasma immersion ion implantation. The minimum dose was experimentally determined independently, and it exceeds $10^{18}$ cm$^{-2}$, i.e., much higher dose than in the Smart-Cut. Silicon has about $10^{18}$ cm$^{-3}$ contamination of oxygen, and also non-negligible concentration of other doping and unintentional impurities evenly distributed in silicon. Some of them works as infinite traps for hydrogen; and the higher dose hydrogen implantation, the bigger amount of hydrogen platelets and bubbles will be created on these unintentional and unavoidable traps. The hydrogen platelets and the bubbles are non-point defects, and silicon that contains these features cannot be annealed to restore its initial perfect lattice. Finally, plasma immersion implantation version of the Smart-Cut results in SOI wafers with low quality superficial silicon. That silicon contains voids in high density.

Another problem with Henley's process is that it results in thinner transferred layers at wafer periphery as compared to the wafer center. This is because the plasma immersion implantation equipment is characterized in non-uniform hydrogen energy across the wafer; higher energy at the center, and lower energy near the edges. Fan et al. in Z. Fan, P. K. Chu, N. W. Cheung, C. Chan, Thickness uniformity of silicon-on-insulator fabricated by plasma immersion ion implantation and ion cut, IEEE Transactions on Plasma Science, Vol. 27, 1999, pages 633–636 given an experimental evidence of thickness non-uniformity of the plasma immersion implantation version of the Smart-Cut; the thickness non-uniformity is a serious quality problem in the final SOI wafer.

As it is explained above, the Smart-Cut can be characterized as a trap-controlled process. An availability of properly located traps determines the Smart-Cut efficacy. Without the traps, hydrogen does not retain in silicon, it outdiffuses. In previous art, attempts where made to improve the Smart-Cut throughput by pre-forming a trap layer for hydrogen and further hydrogen injection. Agarwal et al. described helium-than-hydrogen implantation; Goesele at al., Bower, and Nastasi et al. described boron-than-hydrogen implantation; Usenko described trap-creating implantation followed by hydrogenation by either electrolytic or plasma means. These Smart-Cut improvements either partially resolve the thickness and cost related Smart-Cut issues, or create quality issues.

Agarwal et al (A. Agarwal, T. E. Haynes, V. C. Venezia, O. W. Holland, and D. J. Eaglesham, "Efficient production of silicon-on-insulator films by co-implantation of $He^+$ with $H^+$", Applied Physics Letters, vol. 72 (1998), pp. 1086–1088) describe dual implantation to achieve layer transfer at lower total implantation dose. They report they got the layer transfer at a combined dose of their sequential helium-then-hydrogen implants that is about 2 times lower then minimum dose required in the Smart-Cut ($7.5 \times 10^{15} + 1 \times 10^{16}$ $cm^{-2}$ against $4 \times 10^{16}$ $cm^{-2}$). Due to Agarwal, helium and hydrogen implantation depths should be the same. Even though, they do not attribute the lower total dose needed to the trapping phenomena, this is a possible explanation in the lowering of minimum required dose they observe. Agarwal's approach, however, does not solve the thickness problems of the Smart-Cut.

Goesele et al. in U.S. Pat. No. 6,150,239 described boron-than-hydrogen implantation to achieve a cleavage at lower total implantation dose. They also report about 2-fold drop in minimum implantation dose required to enable the layer transfer. However, Goesele suggests implantation in conditions when boron implantation peak coincide with hydrogen implantation peak. That restrict hydrogen implantation conditions in peakless, i.e., low energy mode. Subsequently, the thickness limitation is the same as in the Smart-Cut, and thin transfers are not enabled by Goesele. Also, Goesele does not describe that the post-boron hydrogen implantation can be performed in high beam current mode. Therefore the throughput problem is not solved by Goesele either.

Bower in U.S. Pat. No. 6,812,547 describes layer transfer where he implants boron, then anneal the wafer, then implant hydrogen to form a fragile layer for further cleavage at a plane where boron acceptor centers are located. Due to Bower's teaching, the boron and hydrogen energies are not required to be chosen by condition that they have the same projection range. Hydrogen can be implanted anywhere in the wafer, and then hydrogen diffuses until it finds boron acceptor centers, and then hydrogen gets trapped at these centers. Therefore, potentially the Bower's technique might be free from limitation on thickness of layer transfers that is inherent to the Smart-Cut, to Agarwal's, and to Goesele's processes, and it might enable ultrathin layer transfers. Even though Bower describes 330-nm transfer only, let us analyze that possibility. We believe that Bower's process cannot enable the ultrathin transfers. The reasons are as follows. Bower teaches to introduce acceptor centers into silicon to enable the film delamination. Due to Bower's teaching, annealing of the boron-implanted wafer result in complete removal of implantation damages and in electrical activation of boron. The activated boron creates acceptor centers in silicon that further work as traps for hydrogen. Hydrogen is implanted deeper into silicon and diffuse after the implantation until it reaches the boron traps. The acceptor impurity (boron) is introduced in an amount of $10^{15}$ $cm^{-2}$ and activated by annealing at 950° C. due to Bower. An acceptor center concentration in semiconductor cannot exceed a solubility limit of given acceptor impurity in semiconductor at activation temperature. In Bower's case, boron solubility limit at 950° C. is $2 \times 10^{20}/cm^3$. Therefore, a layer of $(10^{15}$ $cm^{-2})/(2 \times 10^{20}/cm^3)$=50 nm in thickness will be doped to the boron solubility limit. This means, that a layer with a thickness of 50 nm will trap hydrogen, and it further means that the splitting plane is defined with 50-nm accuracy. The wafer will split anywhere inside of the 50 nm band. Then, at the best, the as-cleaved surface will have a roughness of 50 nm. This says that sub-100-nm layer transfers will be extremely non-uniform in thickness, and thus are not technically featurable for thin SOI production.

Another reason, why Bower's teaching cannot be applied for manufacturing of thin SOI relates to unwanted altering of electrical properties of the transferred silicon layer. Silicon, doped with boron to $2 \times 10^{20}/cm^3$ has resistivity of $5 \times 10^{-4}$ $\Omega cm$. Chips cannot be manufactured in these heavy doped films for several reasons, for example, because carrier mobility drastically drops in heavy doped semiconductors, and also because a depleted zone will not extend through entire thickness of silicon film, so fully depleted devices cannot be manufactured.

Nastasi et al. in J. K. Lee, T. Hochbauer, R. D. Averitt, and M. Nastasi, "Role of Boron for Defect Evolution in Hydrogen-Implanted Silicon", Applied Physics Letters, vol. 83, (2003), pp. 3042–3044 describe that at some combination of boron-then-hydrogen implantation conditions they observe that hydrogen follow either boron-caused damage peak, or boron peak, but they did not found conditions that allow very thin layer transfer.

Usenko in U.S. Pat. No. 6,352,909 describes a process for fabricating SOI wafers using ultrathin transfer of silicon film from a donor wafer to a destination wafer. Usenko uses silicon-into-silicon or other electrically non-active implants to form a shallow trap layer for hydrogen in silicon, and further insertion of atomic hydrogen into the wafer either by electrolytic means or from hydrogen plasma. This process is free from limitations inherent to Smart-Cut cut process as relative to thickness and to implant-related cost, but it is more difficult to get high quality SOI wafers using the U.S. Pat. No. 6,352,909 process. The quality problems appear in both, electrolytic, and plasma methods of hydrogenation. If hydrogen plasma contains low-energy hydrogen (as it happen, for example, in RF plasma), the low-energy hydrogen preferentially interact with silicon surface, instead of entering into the silicon lattice and diffusing to a trap layer. The interaction with surface results in silicon etching. The etching preferentially proceeds on defected surface areas, therefore the etching is not area-uniform, and roughness of silicon wafer surface increases. The rough surface wafer is difficult to bond to a destination wafer. The roughness causes bonding voids between the wafers. The voids cause layer transfer faults, and a final SOI wafer has areas with missing superficial silicon. These wafers are rejected and are not useful anymore. In a case of electrolytic hydrogenation, the chemical solution used as an electrolyte also etches silicon surface. The etching is the strongest in areas where silicon crystalline microdefects intersect the wafer surface. Etching pits appear in these areas. Further, the pits translate into voids of transferred silicon film, and the SOI wafers with missing superficial silicon areas are rejected again.

It will be beneficial to the art to have a process that combines high quality of final SOI wafers as in Smart-Cut process and ability of fabricating ultrathin SOI with high throughput as in processes that use trapping of hydrogen.

SUMMARY OF THE INVENTION

It is an object of the present invention to provide an inexpensive process for creation of fragile layer inside of a single crystalline substrate. The fragile layer enables further cleavage of the wafer along the layer.

It is a further object of the invention to provide a process for creation of shallow fragile layer inside of a single crystalline substrate.

It is a further object of the invention to provide a process for fabrication of silicon-on-insulator wafers characterized in high throughput and low cost.

It is a further object of the present invention to provide a process for fabrication of silicon-on-insulator wafers with thin superficial silicon.

It is a further object of the invention to provide a process for fabrication of silicon-on-insulator wafers having high quality.

According to the present invention, a process of making a fragile layer inside of a donor wafer further comprises steps of:
(1) creating a buried defect-rich layer in a donor silicon wafer around a desired depth
(2) confining thickness, and planarity of the defect-rich layer thus creating a trap layer for hydrogen at a desired depth
(3) inserting hydrogen by ion implanting protium hydrogen into donor wafer with the trap layer to a depth that is bigger, than the depth of the trap layer
(4) relocating the implanted hydrogen from as-implanted depth to trap layer depth thus forming a fragile layer.

To make an SOI wafer, a donor wafer with a fragile layer is processed further. A thin silicon film over the fragile layer is delaminated from the donor substrate and transferred to a destination wafer. This is performed similarly to prior art layer transfer processes, i.e., with stiffening by bonding to a destination wafer, cleavage of a bonded assembly into an SOI and a leftover wafers, and quality conditioning of the SOI wafer.

The buried defect-rich layer is formed by implantation of ion species. The species that are non-doping for silicon are used. The species can be either amorphizing silicon, or non-amorphizing silicon. From non-amorphizing species, deuterium and helium implantations are preferably used.

Amorphizing species are implanted in conditions to form a buried amorphous layer. Species that decrease silicon regrowth rate under solid state epitaxy are preferably used. The regrowth-suppressing species can be either chemically active or non-active to silicon. Implantation of the chemically-active species results in an amorphized layer having specie atoms chemically bonded to silicon. Ion implantation of carbon, nitrogen, oxygen, fluorine, chlorine, bromine can be preferentially used for the defect-rich layer formation with chemically active species. Implantation of chemically inert species results in and amorphized layer having precipitates of specie atoms, for example in a form of gaseous microbubbles. Ion implantation of neon, argon, krypton, xenon can be preferentially used for the defect-rich layer formation with chemically inert species.

Implantation energy for defect-creating species is chosen to obtain a desired depth of a fragile layer, while keeping a surface layer of silicon crystalline; the energy typically falls in a range between 20 keV and 1 MeV.

An implantation dose and temperature are derived from condition to keep silicon surface crystalline and low-damaged, while creating a buried layer that is damaged enough to further serve as a trapping layer for hydrogen. The doses typically fall in a range $2\times10^{15}$ cm$^{-2}$ to $2\times10^{16}$ cm$^{-2}$ for non-amorphizing implants (deuterium and helium), and in a range $2\times10^{14}$ to $2\times10^{15}$ cm$^{-2}$ for amorphizing implants. Implantation temperature is chosen from a condition to obtain an amorphous layer covered by crystalline layer (i.e., buried amorphous layer) for given specie-energy conmbination. The temperature is typically room temperature for non-amorphizing implants and for light amorphizing implants (C, N, O, F, Ne), and 200 to 500° C. for heavier implants (chlorine, argon, bromine, krypton, xenon).

A damaged layer obtained by ion implantation has a finite thickness. It is preferable to minimize that thickness and have borders of the damaged layer to silicon that are as close as possible to a single plane in silicon lattice. Confining of the defect-rich layer works toward this goal. Confining of the thickness and planarity is performed by annealing at temperature in a range from 300 to 600° C. For non-amorphizing implants, the annealing results in preferential removal of defects in tails of in-depth distribution of defects. For amorphizing implants, the annealing result in solid state epitaxial regrowth. The annealing temperature is chosen not to exceed an epitaxial regrowth temperature for heavy doped silicon. This results in self stop of an epitaxial regrowth process as a thickness of the buried amorphized layer decreases. The confined buried defect-rich layer will further serve as a trapping layer for hydrogen.

Inserting of hydrogen is performed by protium hydrogen implanting to a dose in a range from $2\times10^{16}$ cm$^{-2}$ to $10^{17}$ cm$^{-2}$ and energy chosen from condition that projection range of hydrogen exceeds a depth of a trapping layer.

While implanting hydrogen, hydrogen displaces silicon lattice atoms. Majority of displaced atoms returns to their regular sites in silicon lattice, and therefore no defect created in silicon lattice. However, some number of defects is left and those defects further trap the implanted hydrogen. Those defects are created at a depth that is slightly shallower than projection range of implanted hydrogen. This phenomenon enables a Smart-Cut process, but is detrimental for an inventive process. To suppress Smart-Cut trapping of hydrogen, the hydrogen implantation is performed at elevated substrate temperature. The elevated temperature enhances annihilation of defects originated by displaced silicon atoms. In a lack of hydrogen implantation originated defects, hydrogen is not preferentially trapped near hydrogen projection range. After losing an excessive energy, implanted hydrogen diffuses until it finds a trapping site. The substrate temperature during protium hydrogen implantation is typically around 350° C.

In this process, increasing of ion implantation rate does not adversely affect quality of final SOI wafer. Therefore, the implantations can be performed at high dose rate, and the wafer throughput can be substantially increased as compared to prior art processes.

Redistribution of hydrogen implanted hydrogen toward a trapping layer partially happens during hydrogen implantation. However, silicon wafers contain some amount of defects as COPs, precipitated and separate oxygen, doping impurities, etc. Most of those defects are trapping active for hydrogen, and therefore some share of the implanted hydrogen is stored on these defects. It is preferably to de-trap hydrogen from these defects and re-trap hydrogen on a trapping layer formed during previous steps. The detrapping and retrapping is possible between sites that have different hydrogen binding energy. The detrapping-diffusion-retrapping is performed by annealing of wafer at temperature in a range between 250 to 450° C.

Using of ions that are heavier than protium hydrogen for creation of a trap layer allows forming the layer at a shallow depth. Further it allows fabricating a SOI wafer with a thin superficial single crystalline silicon film.

DETAILED DESCRIPTION

The invention is illustrated by three preferred embodiments:
(1) using of deuterium implantation for creation of a trapping layer
(2) using of an amorphizing implantation for creation of a trapping layer
(3) using plasma immersion ion implantation of protium into a denuded wafer.

It is to be understood that the described embodiments are merely illustrative of the invention and that many variations may be devised by those skilled in the art without departing from the scope of the invention and from the principles disclosed herein. It is therefore intended that such variations be included within the scope of the following claims and their equivalents.

DETAILED DESCRIPTION OF THE FIRST PREFERRED EMBODIMENT

This embodiment allows one to fabricate SOI wafers with high throughput.

An embodiment, which will now be described, shows a method for making an SOI wafer with a deuterium implantation for creating a nucleation (trapping) layer for hydrogen and protium hydrogen implantation for saturating the nucleation layer. Neither deuterium, nor protium hydrogen implants have limitation on dose rate; both can be performed in high ion beam current to provide high throughput and low cost.

Figure 4:
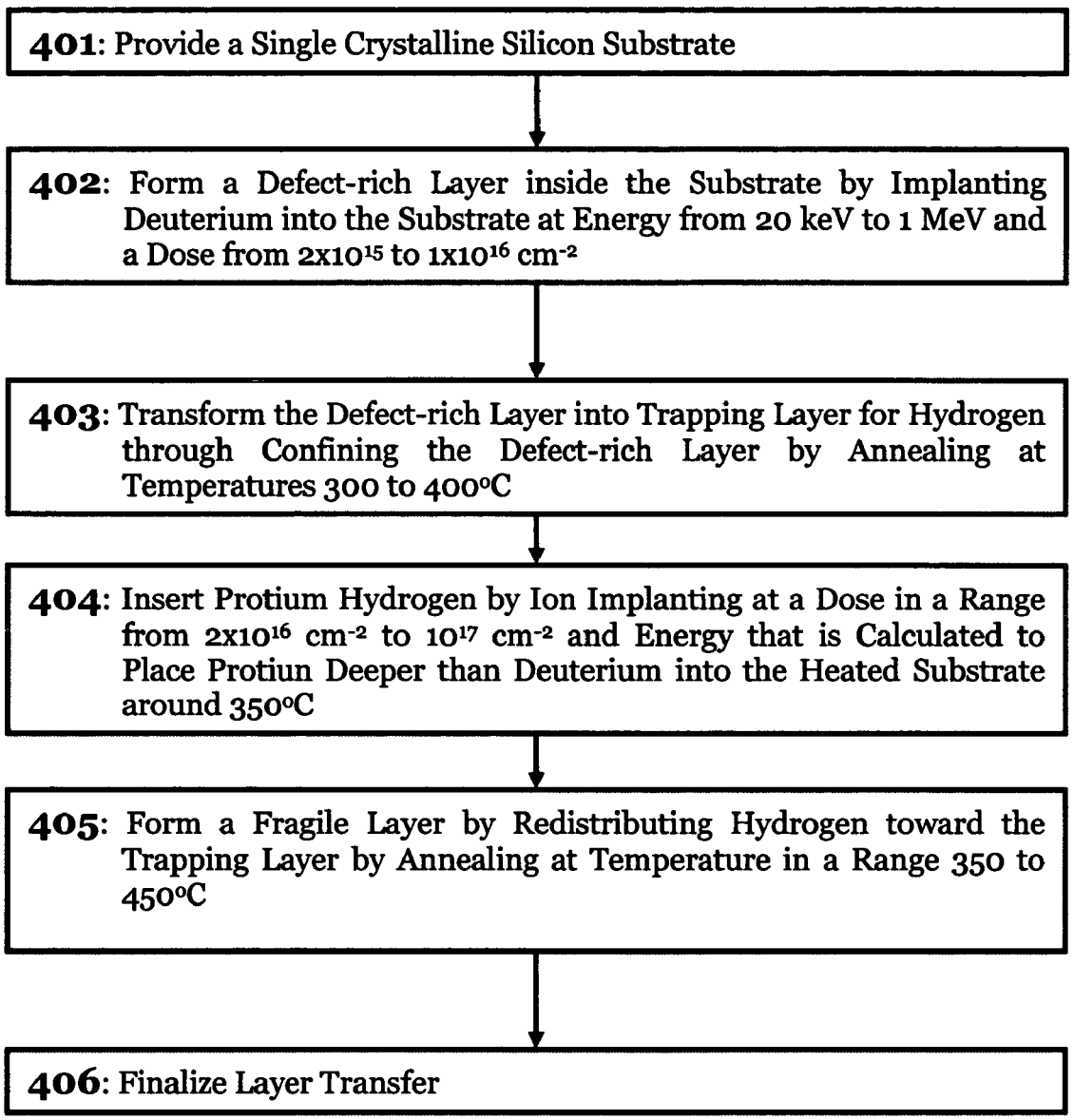
FIG. 4 shows the inventive process sequence due to the first preferred embodiment.

The process flow is illustrated by FIG. 4. At step 401 a starting donor silicon substrate is provided. The donor wafer can be either covered with a grown-in film, or contain no films on its surface. The covered wafer is preferred as it decreases possible contamination that might be introduced during implantations into a film being transferred.

The grown-in films can be obtained by either thermal oxidation of silicon, or by thermal nitridation of silicon, or by other means. Deposited films can also be used, but those are not preferred. The grown-in methods have a built-in property of unifying a thickness of the grown layer, while deposition methods have no such a property, and deposited films tends to have significant thickness non-uniformity and increased surface roughness. The roughness and the non-uniformity adversely affect on quality of subsequent step of wafer bonding, and therefore are not preferable. If deposited films are desirable, they can be used provided that the thickness uniformity and surface roughness of the deposited film is additionally conditioned by polishing to satisfy wafer bonding requirements. The grown-in films can be either sacrificial, or become a part the final SOI wafer. In latter case the film is preferably an electrically insulative film of silicon dioxide, as those films have good electrical properties of Si—SiO$_2$ interface that are advantageable for operation of chips that are further fabricated on the SOI wafers.

Step 402 of inventive process is for creating a defect-rich layer around a desired depth under surface of silicon wafer. At step 402 deuterium is implanted in a donor silicon wafer at energy chosen in a range from 20 keV to 1 MeV and a dose from $2 \times 10^{15}$ to $1 \times 10^{16}$ cm$^{-2}$. The deuterium energy determines a depth location of a fragile layer, and thus it further determines a thickness of transferred layer while making an SOI wafer. That depth is about a depth of maximum of defects originated by deuterium implantation into silicon. The defects results from lattice atom displacements by implanted ions. Those skilled in the art can easy determine the depth for given deuterium energy using data on stopping power of ions in solids, for example from a book by James F. Ziegler "Hydrogen Stopping Powers and Ranges in all Elements", 317 pages, Pergamon Press (1977) or by using computer simulation programs like SRIM. For example, to create a fragile layer at 500 nm below silicon surface, D$^+$ ions should be implanted at energy 45 keV, or D$_2^+$ ions should be implanted at energy 90 keV. A deuterium dose rate can be as high as it is available from the state-of-the-art implanters. In very high current implanters, the wafer heating by the ion beam might put a limit. The wafer temperature rises during implantation and reaches its maximum at the end of implantation. The maximum temperature should not exceed 350° C. At step 402, ion beam heating above 350° C. does not cause process failure, but at these temperatures a self-annealing of created defects becomes too strong, so reaching of a desired defect density requires much higher dose, than for a case of near-room-temperature implantation. The step 402 does not impose a risk of premature blistering, as it happen in prior art process, see FIG. 3, and therefore the implanting step can be performed in much shorter time than in the prior art Smart-Cut™ process. The blistering can potentially occur if a total dose exceeds $10^{16}$ cm$^{-2}$; the step 402 however is performed at lower dose. Also, implanted protium and deuterium behave differently in the silicon lattice. Many protium atoms can attach to a vacancy or vacancy cluster, while only one deuterium atom attaches to a vacancy or vacancy cluster. When big number of protium atoms attach to a vacancy trap, the attached protium rearranges into molecular hydrogen, and makes a pressurized bubble. As protium is bubble-forming while deuterium is not, blistering easily happen in a case of protium implantation, while deuterium implant has to be performed in much higher dose to cause the blistering.

Figure 3:
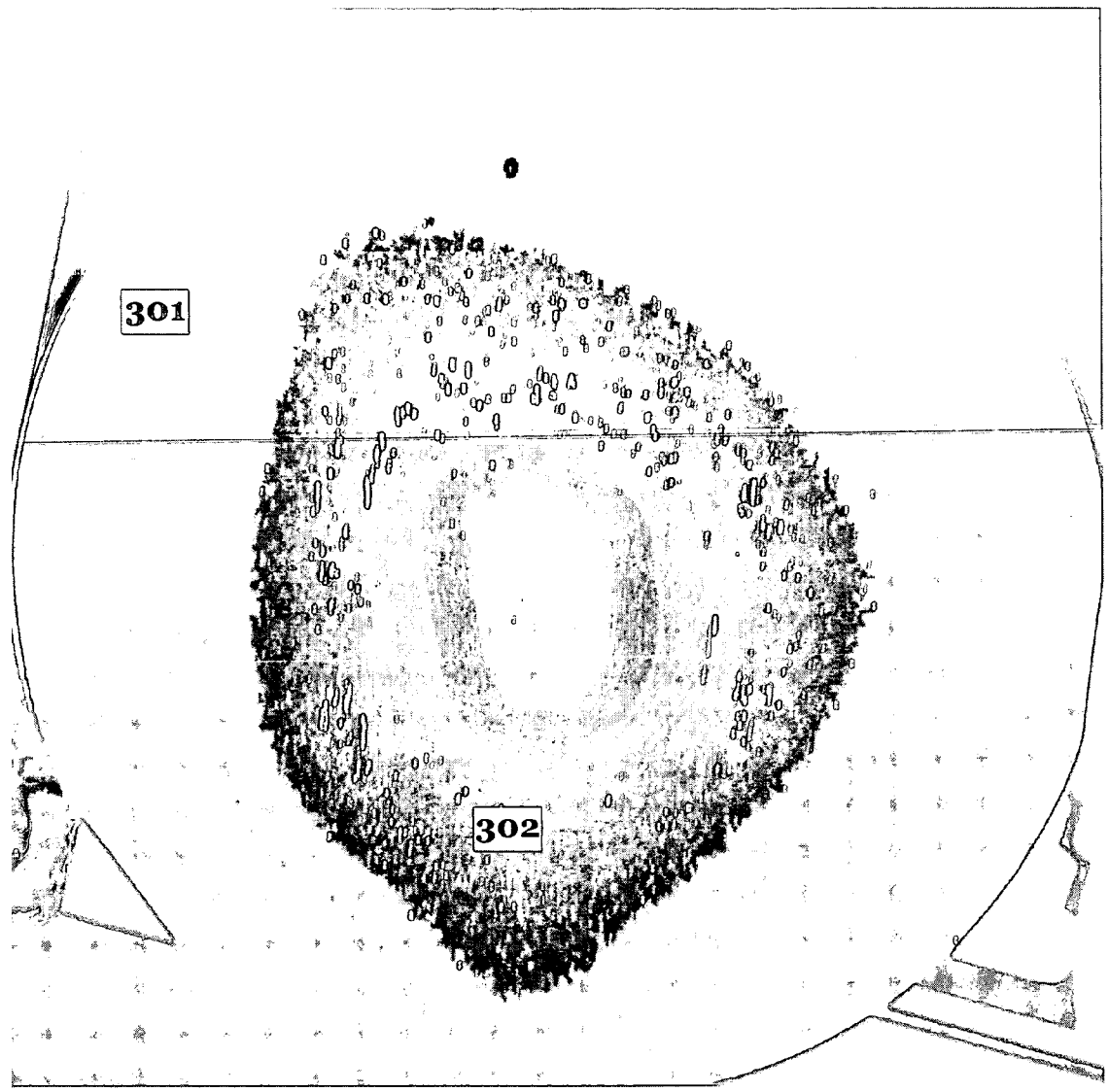
FIG. 3 is a photo of a silicon wafer implanted with hydrogen due to prior art Smart-Cut process showing a typical process failure due to wafer surface blistering.

The unwanted blistering, see FIG. 3 that easily happens in prior art Smart-Cut process and limits the Smart-Cut throughput, does not happen in the inventive process. In the Smart-Cut, the premature blistering is enabled because a small number of big hydrogen bubbles are formed. The big bubbles develop high pressure inside. The high pressure further causes fracture of silicon overlaying the bubble. Protium hydrogen implanting in the Smart-Cut proceeds in a trap-deficit mode. A close-to-perfect silicon lattice itself does not have enough trapping sites for hydrogen, and implanted protium hydrogen diffuses and collects into big bubbles on small number of traps. In prior art Smart-cut process, traps are created by displacement of lattice silicon atoms by moving protium hydrogen ions. In the Smart-Cut, both processes—creation of traps for hydrogen and delivery of hydrogen is performed in a single processing step that is protium hydrogen implantation. The protium implantation itself does offer an opportunity to optimize the trap creation.

Figure 5:
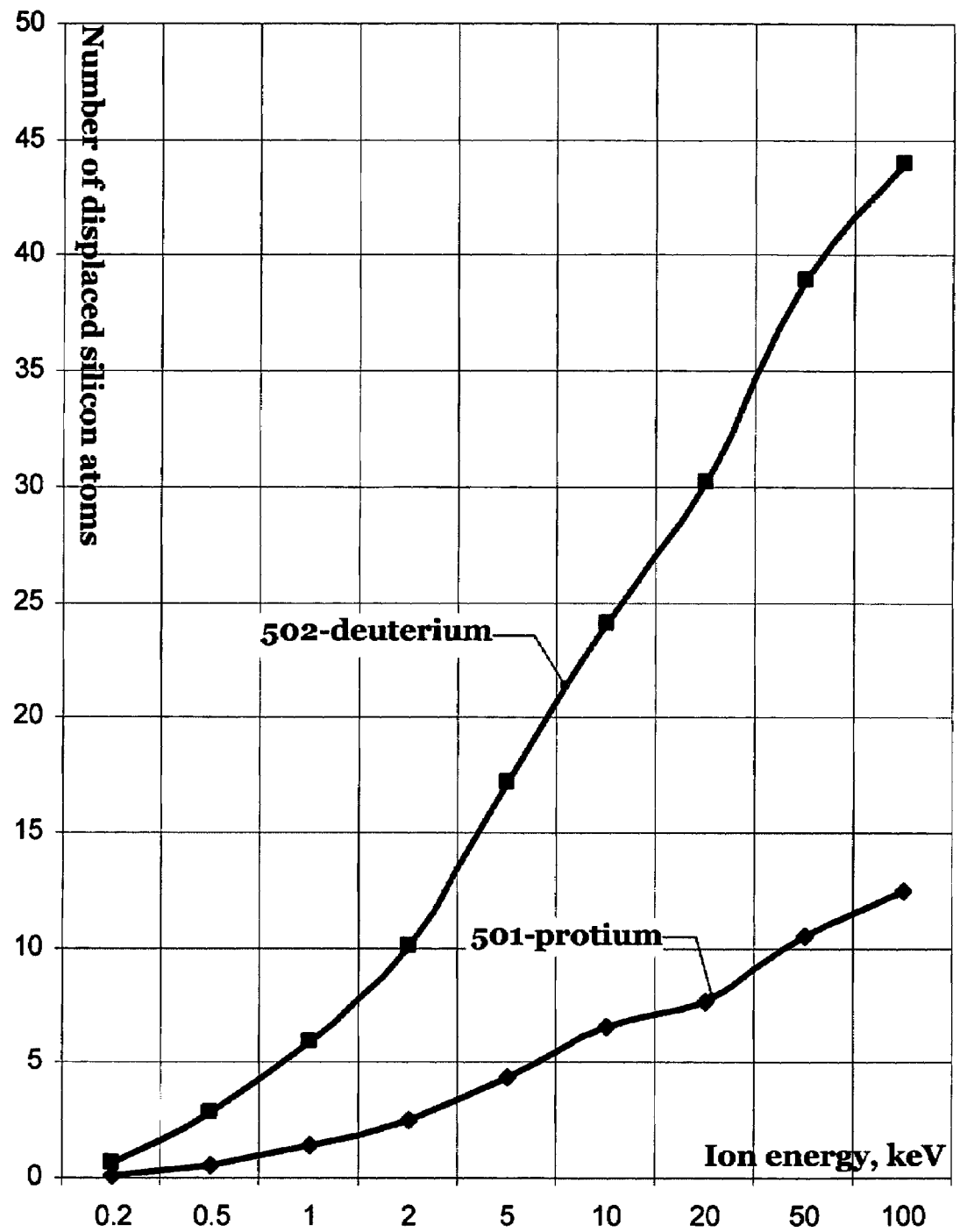
FIG. 5 is a plot of a number of displaced atoms in silicon lattice by protium ions and by deuterium ions at different implantation energies.

A curve 501 on FIG. 5 is obtained by computer simulation of implantation using SRIM 2003 program, and it shows a number of displacements made by protium hydrogen ion in silicon at different implantation energies. The number of displaced atoms allows estimating a number of traps for hydrogen created. As more then 90% of displaced silicon atoms returns to their proper lattice position and no defect created, the protium hydrogen implantation creates about one hydrogen trap at energies 50–100 keV, and less then one trap at energies below 50 keV. The plain protium hydrogen implantation does not offer a freedom to optimize hydrogen retention in silicon. In the inventive process, the trap creation and hydrogen delivery are performed in separate processing steps that are steps 402 and 404 in current embodiment. With separate processing steps it is possible to optimize independently both, the trap creation, and the hydrogen delivery. A curve 502 on FIG. 5 shows a number of displacements made by deuterium. Deuterium is twice as much heavier, than protium, and therefore it makes more displacements in the silicon lattice. Subsequently, more traps for hydrogen are created. As it can be seen from the curve 502 FIG. 3, deuterium makes about 3 times more displacements than same energy protium, which translates in proportionally higher concentration of traps for hydrogen.

SRIM simulations shows that 97.5% of energy losses of implanted 20-keV protons are due to ionization, 0.5% goes for generating phonons, and only 0.05% goes for generating displacements. In average, each implanted 20-keV proton generates 7 vacancies. 20-keV implanted deuterium loses 93% of energy due to ionization, 1% for generating phonons, 0.12% for generating displacements, and the rest for recoils. In average, each implanted deuteron generates 22 vacancies. Both, protium, and deuterium atomic masses are much smaller, then mass of target lattice atoms (i.e., silicon): 1, 2, and 28 respectively. If the bombarding ion mass is much smaller, then the target ion mass, only small share of ion energy goes for displacing target atoms. Therefore, both ptotium, and deuterium generate small number of defects in silicon. However, as deuterium is twice as heavier, than protium, it generates about three times more displacements. In other words, deuterium has triple advantage over protium in creating traps for hydrogen. Further, the created vacancy type defects will act as traps for protium hydrogen. In the D-then-H implantation scheme, deuterium creates enough traps for hydrogen, and majority of the implanted protium hydrogen retain in silicon film further contributing to delamination of silicon film.

Figure 6:
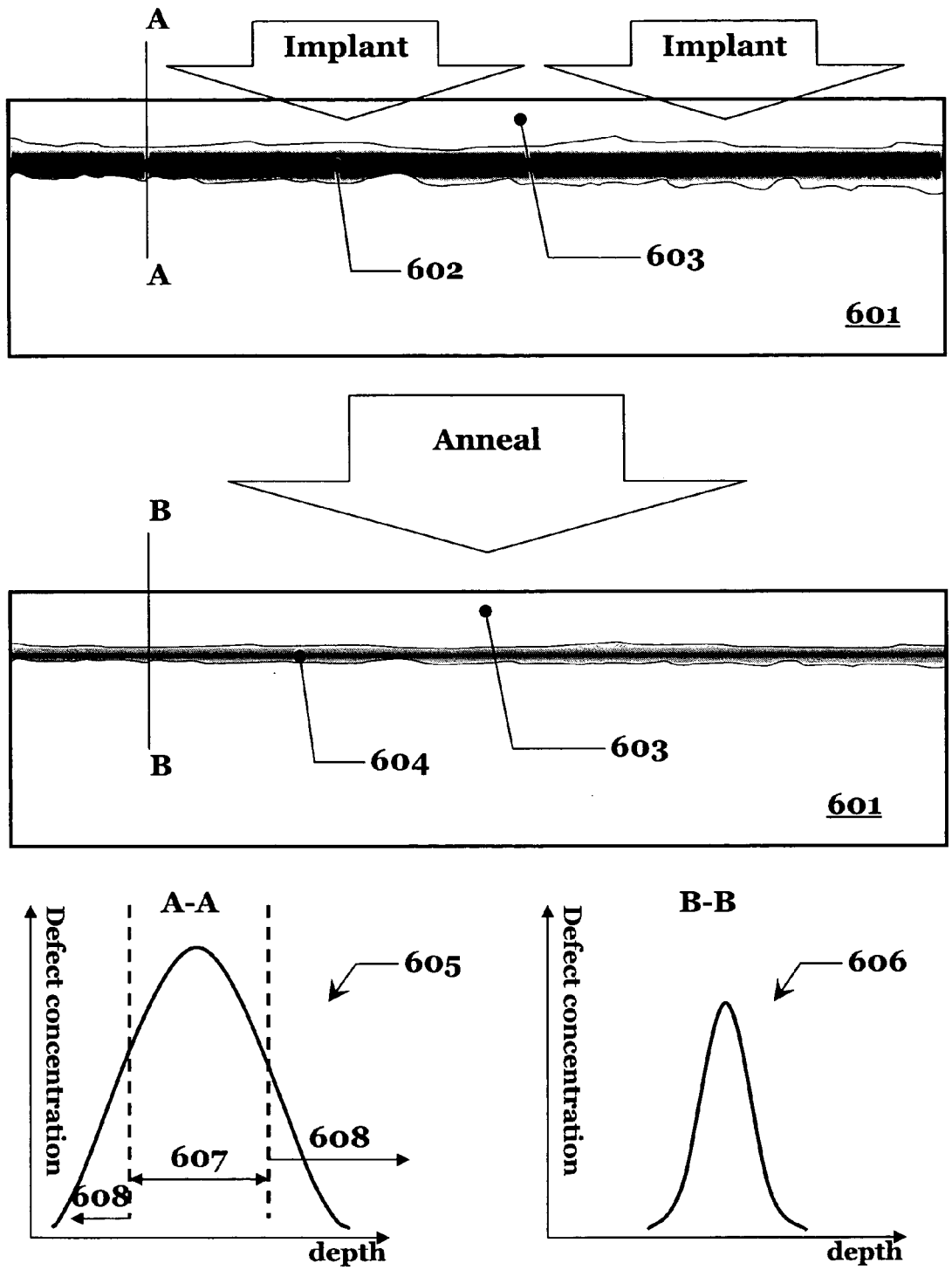
FIG. 6 illustrates evolution of defect-rich layer obtained by non-amorphizing species under annealing.

The defect-rich layer created at step 402 can readily serve as trapping layer for hydrogen. However, if deuterium as-implanted wafer is subjected immediately to saturation with hydrogen, and then undergo layer transfer, the transferred layer will have low quality. Step 403 optimizes the defect-rich layer to serve as a trapping layer for hydrogen, and finally facilitate high quality of a transferred layer, i.e., high quality SOI wafer. At step 403 the wafer is annealed at 300 to 400° C. during 1 to $10^5$ s. The purpose of the annealing is to minimize an amount of hydrogen trap-capable defects that are out of the main trap plane. FIG. 6 illustrates the step 403. Wafer 601 is deuterium implanted, and a quite thick defect-rich layer 602 covered by almost non-disturbed silicon layer 603 is created. The defects are created by ion implantation process that is statistical in nature and it results in traps for hydrogen that are distributed in some depth range. Further hydrogenation of the traps lying at different depths will result in hydrogen platelets and bubbles located at a range of depths under the wafer surface. As there is no a single plane along which the cleavage will proceed, the cleavage plane will follow a contour of maximum hydrogen bubbles and platelets. It will decrease a quality of a final wafer by adding a surface roughness. The surface roughness can be improved by an additional polishing step. However, as the hydrogen-rich layer has some depth, hydrogen bubbles and platelets that left inside of the transferred layer will transform into voids after final anneal of the wafer. Only polishing out of the whole void-containing layer can fix the quality problem of the transferred silicon layer. Polishing adds thickness non-uniformity of superficial silicon, which is also detrimental to the final SOI wafer. Therefore, the optimum way to obtain high quality SOI wafer is to minimize a thickness of hydrogenated layer. Further, it require that hydrogen trap density is minimized everywhere in the wafer except of a single lattice plane. The confining step 403 works toward this goal. An inlet 605 on FIG. 6 schematically shows defect distribution along a cross-section A—A of an as-implanted wafer 601. The distribution 605 is wide and has an inner part 607 and tails 608. The hydrogen traps around a depth of maximum of displacements 607 of target atoms are typically deuterated multi-vacancies, while at the tails 608 of the displacement peak there are more deuterated vacancies, and non-deuterated vacancy complexes. Among these types of defects, the deuterated multi-vacancies have the highest thermal stability, i.e., they anneal out at higher temperature then the rest of trap sites mentioned. The annealing step 403 removes the lower thermally stable sites populating areas 608, while it leaves almost unchanged the useful deuterated multi-vacancies populating the area 607. An inlet 606 schematically shows defect distribution along a cross section B—B of a wafer subjected to the step 403. The defect distribution 606 has slightly lower defect concentration in maximum as compared to the distribution 605, while it is much narrower in depth as compared to the distribution 605. In the step 403, temperatures under 300° C. are not effective, as most of trap sites survive that temperature, and desired narrowing and clearing of trap profile is not achieved. Temperatures over 400° C. are not effective because of excessive annealing out of traps for hydrogen even in a peak of the trap distribution. Time of annealing does not affect on the annealing results as strongly as temperature, and it is usually determined from criterion of achieving the highest throughput. If annealing equipment like a diffusion furnace is used in the 403 step, the time of about one hour is typically chosen, while if rapid thermal annealing equipment is used, the time is typically in seconds range.

At step 404 the wafer is implanted with protium hydrogen in form of either $H^+$, or $H_2^+$, or $H_3^+$ at a dose in a range from $2 \times 10^{16}$ cm$^{-2}$ to $10^{17}$ cm$^{-2}$ and at energy that delivers protium deeper, then deuterium was implanted at previous step 402, i.e., protium implantation energy at step 404 is chosen higher, than deuterium implantation energy at step 402. A protium hydrogen dose rate can be as high as it is available from the implanter, and might be limited by about 100 mA/cm$^2$ s on high-dose and high-energy side of suggested range. The ion implantation should be prepared in a mode when trapping of hydrogen by defects created by itself is suppressed. This condition is satisfied by implantation 404 into a heated substrate with a substrate temperature to about 350° C. On the other hand, the substrate temperature should be low enough to avoid hydrogen losses due to outdiffusion. From this condition, the wafer temperature should not exceed 350° C. If hydrogen beam current is high, the wafer heating by the beam is not negligible. Wafer temperature monitoring and control can be used when needed to exclude heating over 350° C. during the step 404. During the step 404 protium hydrogen is initially delivered by implantation deeper, than trapping layer 604 obtained at step 403. Than the protium hydrogen diffuses toward wafer 601 surface and toward wafer bulk 601. Hydrogen that diffuses toward surface is then mostly collected by the layer 604. Some hydrogen diffusing toward surface is collected on Smart-cut (protium-self-made) traps, as it is not possible to suppress completely the Smart-cut effect by heating limited to 350° C. If the protium hydrogen is implanted much deeper then a trapping layer, about ½ of the implanted protium is collected in the trapping layer, while another ½ outdiffuses from the wafer 601 through the wafer bulk. If protium hydrogen is implanted slightly deeper, than layer 604, than majority of the implanted protium hydrogen get collected by the layer 604. Therefore, it is preferable do not choose protium implantation energy much higher, than deuterium implantation energy.

Another reason to limit the protium hydrogen implantation depth relates to reuse of the wafer 601 and make multiple layer delaminations from the same wafer. This is important for low cost SOI wafer manufacturing process. To reuse the wafer, a layer thicker than the protium implantation depth has to be removed by polishing. As protium-self-made trapping is not completely suppressed in the inventive process, silicon gets contaminated with hydrogen bubbles to about a protium implantation depth. These bubbles are not completely removable by annealing. Annealing only transforms them into empty voids. If not polished away, the void-contaminated material will be transferred resulting in low quality SOI wafer. Deep protium implant will then further require thick layer to be polished away, that increases manufacturing costs.

A significant difference of step 404 as compared to Smart-cut hydrogen implantation step is that the step 404 does not impose a risk of wafer surface blistering under implantation. Wafer 601 has plenty of trapping sites for hydrogen and it behaves differently under hydrogen implantation 404, than a plain oxidized wafer used in Smart-cut under non-heated hydrogen implantation. The same cleavage-enabling hydrogen dose of ½×10$^{17}$ cm$^{-2}$ results in big number of small hydrogen bubbles in inventive process, and small number of big bubbles in the prior art Smart-cut process. Small bubbles do not cause blistering, while big bubbles do cause blistering, see FIG. 3. The blistering limits an implantation dose rate in Smart-cut, thus limiting its throughput. The inventive process is blistering-free even at very high dose rates of the protium implantation, and therefore it provides high throughput/low cost.

Implanting of protium hydrogen at step 404 to a depth that is shallower than a depth of the trapping layer 604 results in a loss of quality advantages of the inventive process. If protium hydrogen is implanted into layer 603, than some hydrogen will be trapped inside of the layer 603 onto protium-self-made (Smart-cut) traps. Under further processing, some hydrogen bubbles will be formed inside of a layer to be transferred, and further the final SOI will contain microvoids inside of the superficial silicon layer. Another type of layer transfer defect also occurs if protium is shallow implanted. Implantation is typically performed through an oxide of an oxidized wafer. A Si—SiO$_2$ interface also has a property of trapping hydrogen. If protium is implanted between trapping layer 604 and Si—SiO$_2$ interface, the trapping layer and the interface compete for trapping hydrogen. If significant amount of hydrogen is trapped onto the interface, it further results in layer transfer of SiO$_2$ layer only or in voids at Si—SiO$_2$ interface in a final SOI wafer.

SOI wafers manufactured by an inventive process have higher quality than the wafers obtained by prior art processes. The quality advantage is in lower concentration of voids inside of the superficial silicon layer of SOI wafer and on Si—SiO$_2$ interfaces. This is a result of a shielding effect by the trapping layer 604 to protium hydrogen. The protium hydrogen is initially implanted deeper, than the layer 604; further it diffuses toward layer 603 and Si—SiO$_2$ interface above, but no hydrogen reaches neither layer 603, nor the interface, as all that hydrogen get trapped inside of the layer 604.

At step 405 the wafer is annealed at 350 to 450° C. during 1 to 10$^4$ s. The purpose of the annealing is to further redistribute hydrogen toward the main trap plane, i.e., minimize hydrogen content in out of main trapping plane areas, and maximize hydrogen content in the main trap plane. As it was mentioned above, step 404 does not possess a total suppressing of Smart-cut trapping. Step 405 facilitates detrapping of hydrogen from protium-self-made traps, further diffusion, and retrapping at the trapping layer 604. At step 405, temperatures under 350° C. are not effective, as detrapping is not yet enabled. Temperature over 450° C. are not effective, as due to strong detrapping-retrapping hydrogen starts redistributing inside of the trapping layer making bigger bubbles in expense of smaller ones, and start creating cracks between neighboring bubbles.

If the wafer 601 has oxide other film on its surface, it puts additional limitations on energies of the both, trap-, and protium implants. The energies of trap-making implants should have a depth of maximum displacements inside of silicon, i.e., deeper than the oxide film. Those skilled in art can determine proper energy using Monte-Carlo simulation program SRIM developed by Ziegler and Biersack, see www.srim.org.

Figure 2:
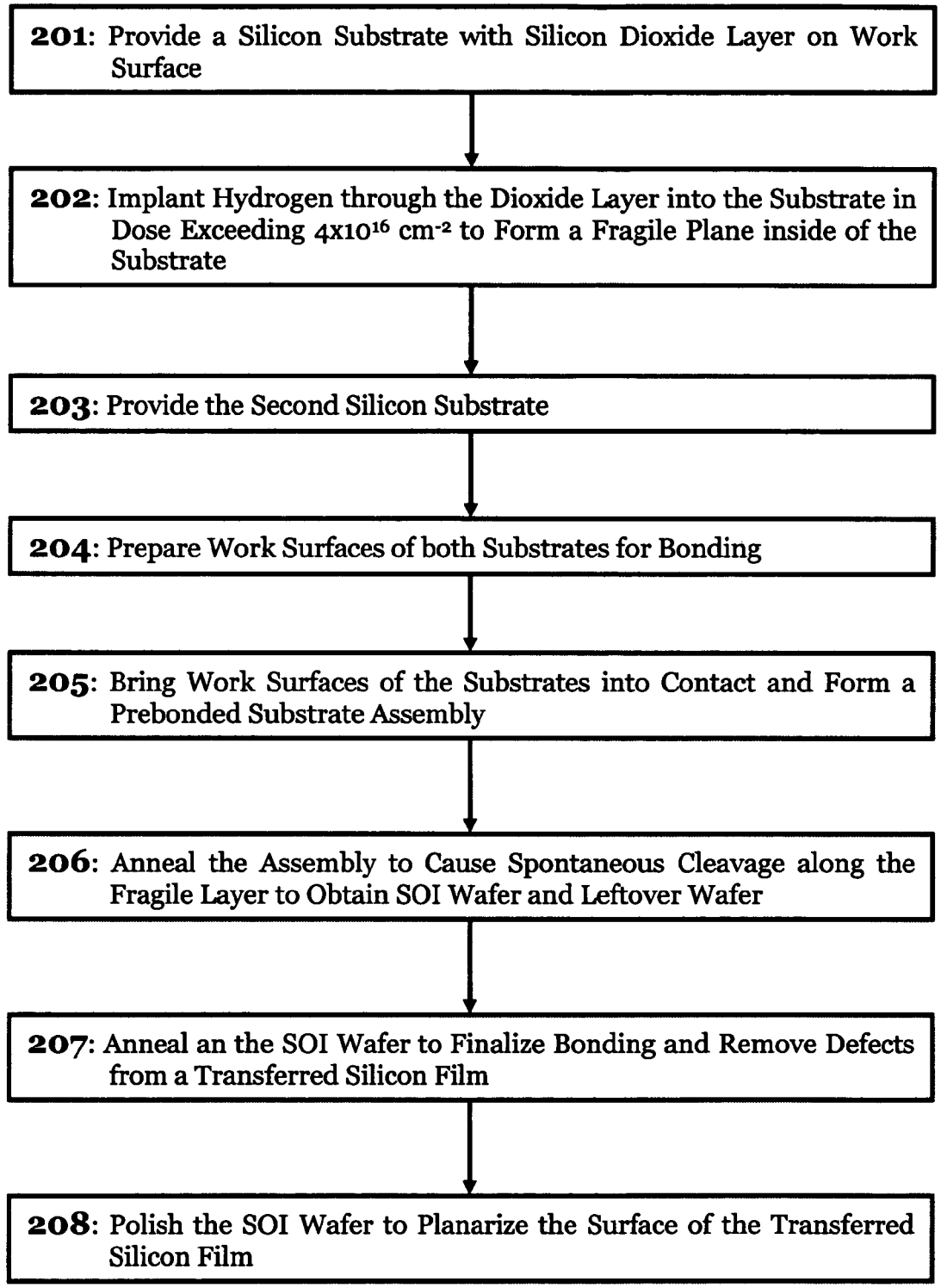
FIG. 2 is a simplified process flow for the prior art Smart-Cut process.

After completing the step 405 the fragile layer is formed. By step 406 a layer transfer process can be finalized by repeating steps 203 to 208 of prior art process FIG. 2.

DETAILED DESCRIPTION OF THE SECOND PREFERRED EMBODIMENT

This embodiment allows one to fabricate SOI wafers with a very thin superficial silicon layer.

An embodiment, which will now be described, shows a method for making an SOI wafer with amorphizing ion specie implantation and by protium hydrogen implantation. Nitrogen can be used as the amorphizing specie. Both, nitrogen implant, and protium hydrogen implant can be performed in high ion beam current to provide high throughput and low cost.

Figure 7:
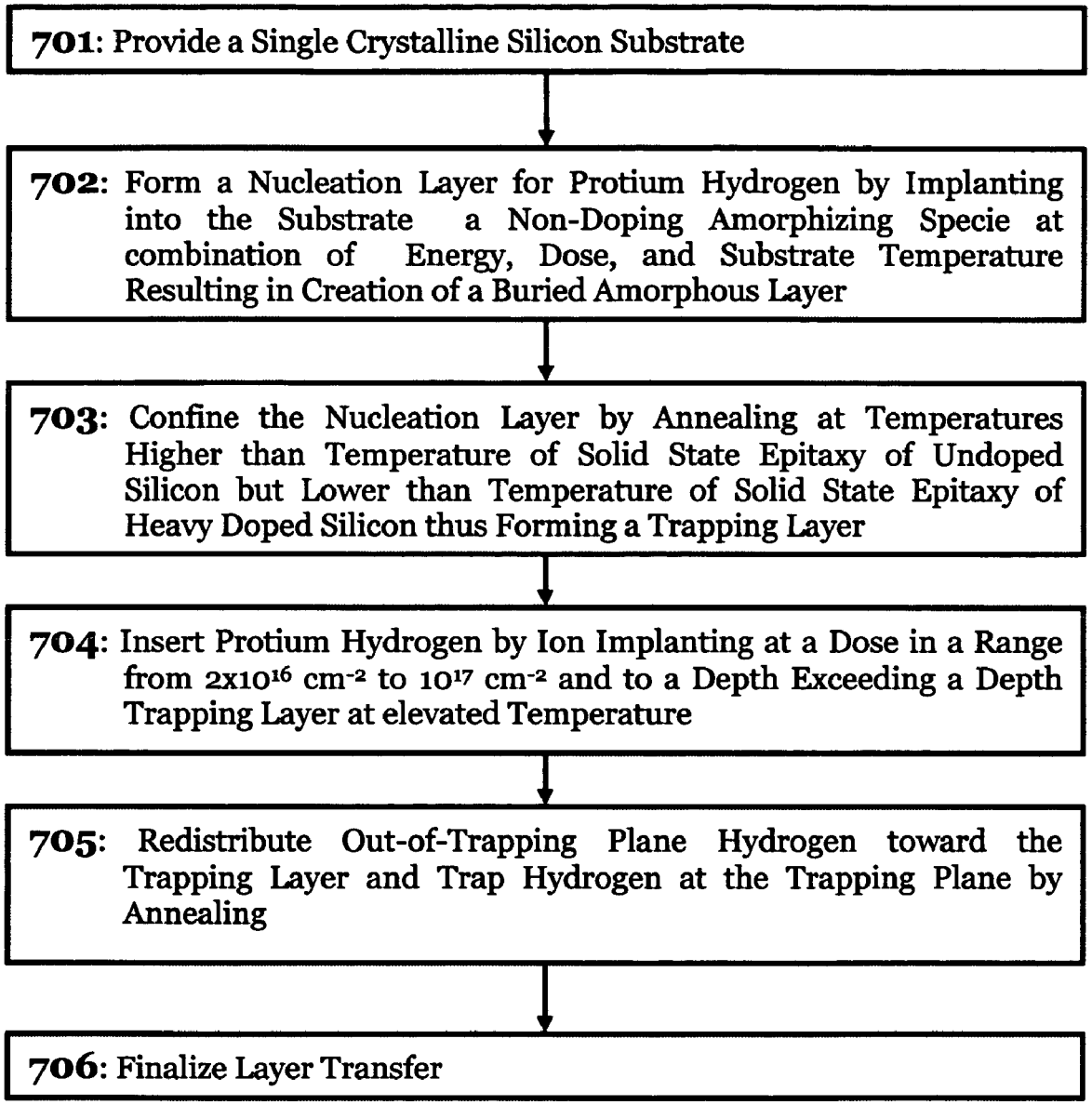
FIG. 7 shows the inventive process sequence due to the second preferred embodiment.
Figure 8:
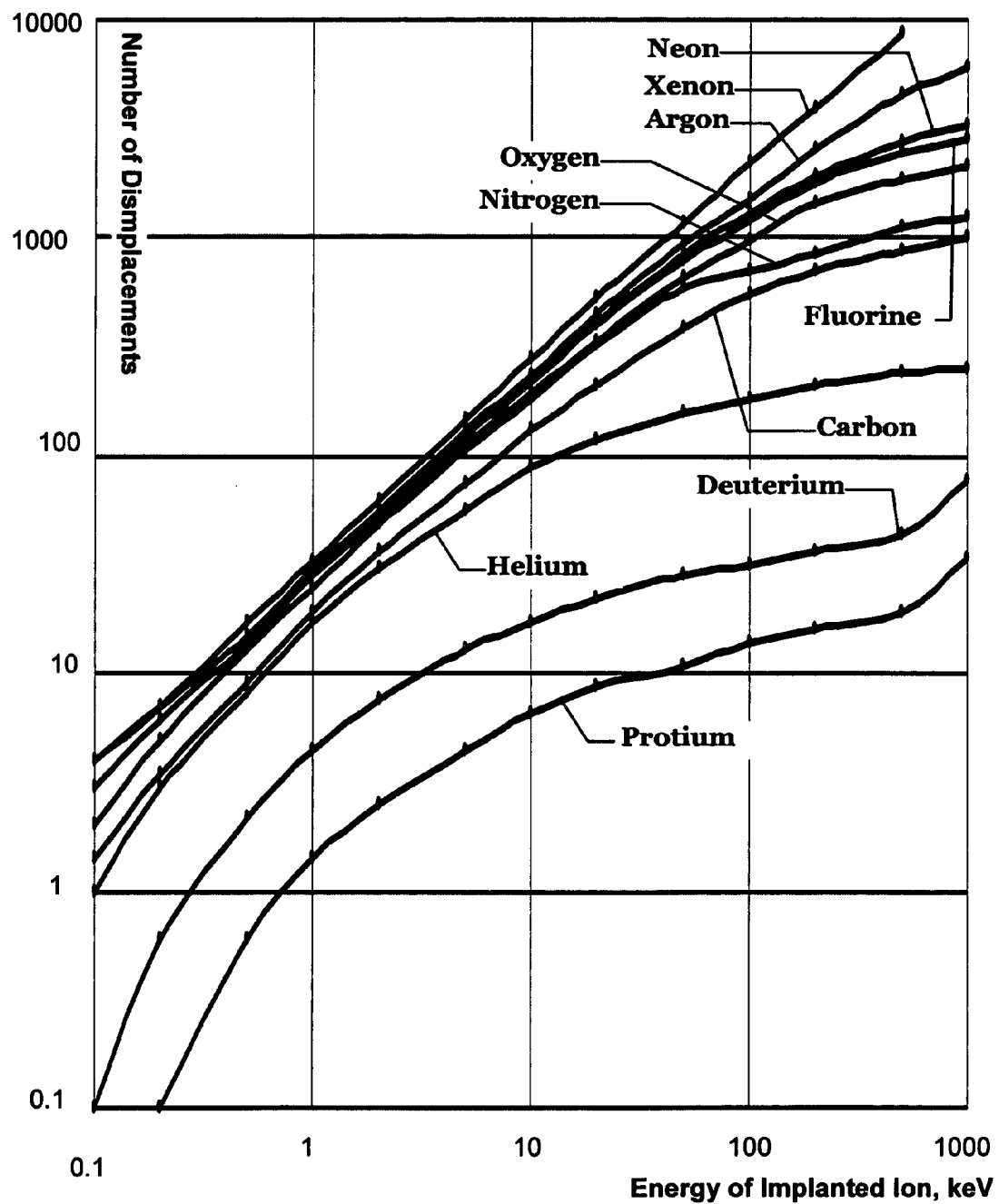
FIG. 8 is a plot of number of vacancies generated in silicon by implanting ions with different atomic masses.
Figure 9:
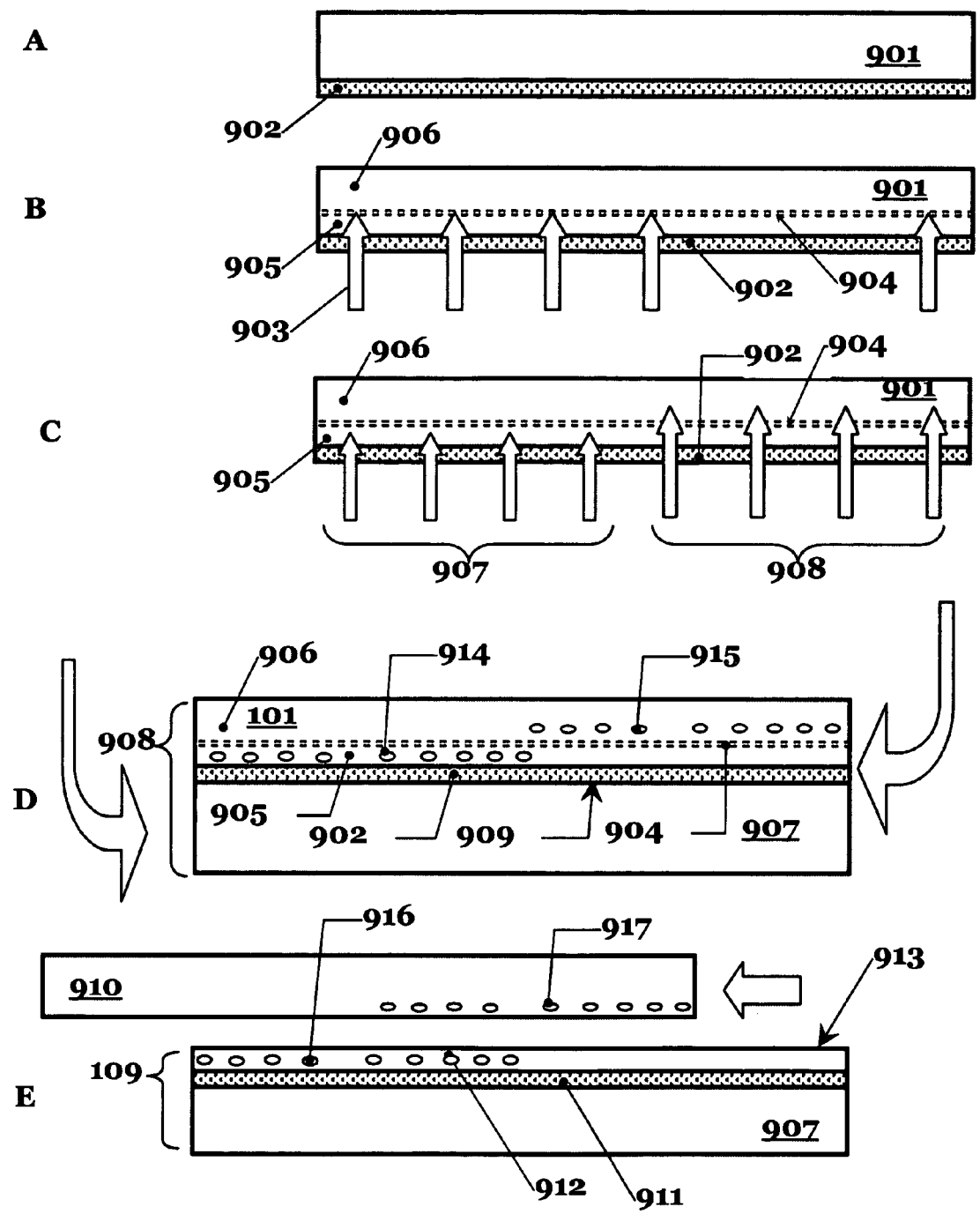
FIG. 9 comparatively illustrates defectiveness of superficial silicon in SOI wafers obtained by protium implant below and above the trap layer.
Figure 10:
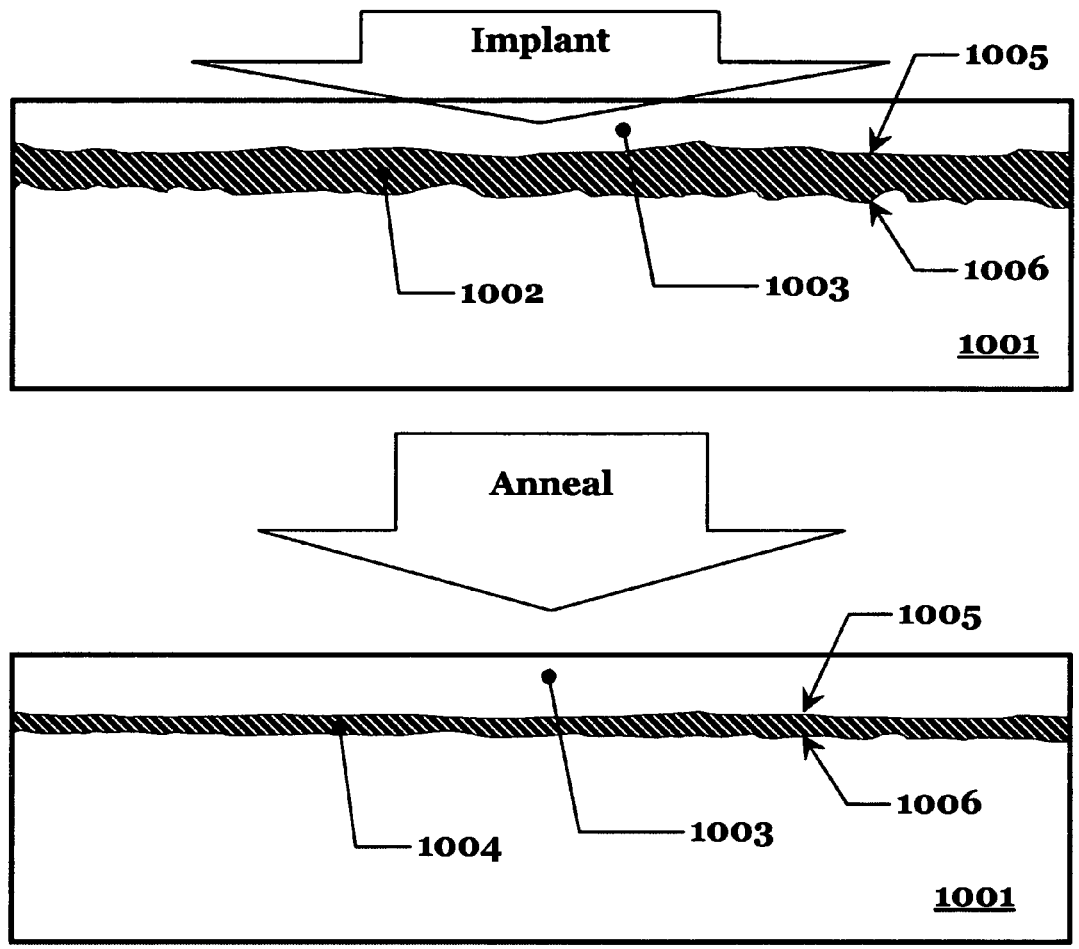
FIG. 10 illustrates evolution of defect-rich layer obtained by amorphizing species under annealing.

The process flow is illustrated by FIG. 7. Further details of the current embodiment are also illustrated by FIGS. 8–10. The process starts from ion implantation into an initial silicon wafer 701. The wafer can be bare silicon wafer or oxidized silicon wafer. The oxidized wafer is preferable as it prevents contamination of silicon, especially a layer to be transferred. The initial wafer can have other than $SiO_2$ films on its surface. The ion implantation step 702 creates a controllable damage of silicon lattice. The implantation conditions at step 702 are chosen to form a buried amorphized layer 1002 FIG. 10 of silicon that is covered by low damaged silicon and silicon dioxide layers 1003 FIG. 10. Ion species that can be used at step 702 should satisfy the following conditions: (1) not affect significantly electrical properties of silicon (2) decrease a speed of solid state epitaxy of silicon. Impurities, as boron, that affects electrical properties of silicon are not desirable as they make inconvenient manufacture of semiconductor devices on SOI wafers fabricated using the method of silicon layer fragilization. The suppressing of a solid state epitaxy by the specie is used in an inventive process at the next step 703 of the process to enable confining with a self-stop feature of the trapping layer for hydrogen. Species that satisfy the above conditions are carbon, nitrogen, oxygen, fluorine, neon, chlorine, argon, bromine, krypton, and xenon.

Room temperature implanting of any specie, that is heavier than boron, can result in amorphizing of a layer in a single crystalline silicon target, i.e., in silicon wafer. The step 702 is for creating an amorphized layer 1002 FIG. 10 around some depth inside of silicon. A layer of silicon 1003 FIG. 10 above the defect-rich depth should have low defectivity. At least it should keep single crystallinity. If ion implantation conditions are chosen properly, the implantation results in creation of a buried amorphized layer 1002 as it shown on FIG. 10. Relatively light species (C, N, O, F, Ne) form buried amorphized layers during room temperature implantation. Heavier species, for example, xenon, form wider amorphized layer, so it typically extends to the surface of the target, and a surface amorphized layer is created instead of a buried amorphized layer. The implantation condition should be chosen to provide a buried, not a surface amorphized layer. For heavy species (Cl, Ar, Br, Kr, Xe), this is performed by implantation into a heated target. Heating of the target to 200–500° C. results in creation of a buried amorphized layer. An implantation dose is chosen to exceed an amorphization threshold dose for given specie and target temperature; the dose should not, however, significantly exceed the threshold dose, as a thickness of the buried amorphized layer increases with the dose in expense of thickness of the overlaying single crystalline silicon, and at some dose, the buried amorphized layer will transform into a surface amorphized layer. The threshold amorphization dose is about $10^{15}$ cm$^{-2}$ for room temperature implantation of medium mass species (C, N, O, F, Ne) and for heated-target implantation of the heavier species (Cl, Ar, Br, Kr, Xe). The threshold dose decreases with ion specie mass, because heavier ions produce more displacements in the silicon lattice. FIG. 8 shows simulation results with SRIM 2003 program for number of displacement produced by different implanted species into silicon target kept at room temperature. One skilled in the art can properly determine conditions of obtaining the buried amorphized layer in silicon either using published data, for example "Tables of Ion Implantation Spatial Distributions" by A. F. Burenkov, F. F. Komarov, M. A. Kumakhov, M. M. Temkin, Gordon & Breach Science Publishing, 1986, 462 pages, or experimentally by implanting a set of samples at different doses and structurally analyzing them.

Implantation energy determines a location of an amorphized layer 1002 FIG. 10 in silicon and, therefore, it further will determine an in-depth location of the trapping layer 1004, an in-depth location of a fragile layer formed after the hydrogen insertion, and a plane of cleavage of the wafer. The cleavage plane proceeds closely to a bottom interface 1006 of the confined amorphous layer 1004 FIG. 10, if further hydrogen insertion is performed due to the inventive process. A center point of the layer 1004 about coincides with depth location of maximum of displacement produced by given specie at given energy. That depth location decrease with increase of mass of implanted specie, and increase with energy of the implanted specie, and it can be controlled in a range between about 30 nm for heavy species, low energies (xenon at 50 keV) to about 1 micrometer for light species, high energies (carbon at 500 keV).

The buried amorphized layer 1002 can readily serve as a trapping layer for hydrogen. However, if the as-implanted sample undergoes further processing to obtain an SOI wafer, the SOI wafer will have low quality as the cleavage will tend to follow either top, or bottom interfaces of the amorphized layer 1002, so it will have an excessive roughness. To secure the high quality of the SOI, the initial layer 1004 is confined at step 703 by annealing at 500–600° C. A temperature at step 703 is chosen to enable a solid state epitaxy of silicon. Under the solid state epitaxy, there are two crystallization fronts, one at an upper interface 1005 between crystalline and amorphous silicon, of the amorphized layer 1002, and another one at a bottom interface 1006 of the layer 1002. During the solid state epitaxy, two crystallization fronts at interfaces 1005 and 1006 moves toward each other, thickness of the amorphized layer 1002 decreases, and it transforms into a confined layer 1004 FIG. 7. Also, in the as-implanted wafer after the step 702, there is a significant amount of defects outside of the amorphized layer 1002, in both layer 1003, and in wafer bulk side 1001 near the amorphized layer. These defects can also serve as the trapping sites for hydrogen, hydrogen bubbles and platelets will be distributed in silicon and not located at a single desired plane; further cleavage will proceed along different depths though the wafer area resulting in transfer of a layer that is highly non-uniform in thickness. During the step 703 the undesirable defects are annealed out, and therefore the improperly located hydrogen trapping sites are removed. During the solid state epitaxy of doped silicon, impurities redistribute differently. Some impurities tend to keep on an amorphous side of the crystallization front, while other impurities easy incorporate into the newly grown crystal. Also, a doping level affect on a speed of moving of the crystallization front at given temperature. For example, impurities as boron, phosphorus and arsenic increase the regrowth rate. Silicon wafer implanted with those species in the buried amorphizing layer mode, and further annealed in a solid state epitaxy mode, will completely regrow until two crystallization fronts meet. The meeting plane has some amount of defects as twins, dislocation loops, etc. Concentration of these defects, however, is not sufficient to trap hydrogen in an amount $>10^{16}$ cm$^{-2}$, that is needed to enable cleavage along that layer. Similar regrowth behavior appear in case of implantation of species that does not affect on the regrowth rate. For example, it happens in a case of making a buried amorphized layer by silicon-into-silicon implantation. If the buried amorphized layer is obtained by implantation of species with segregation coefficient <1, continuing of solid state epitaxy results in increasing of the impurity concentration in the amorphous layer left. Higher impurity concentration stronger impedes the regrowth rate, the solid state epitaxy rate slows with thinning of the remaining buried amorphized layer, and at certain point the solid state epitaxy reaches an equilibrium point and stops. Two crystallization fronts do not meet, and a finite thickness amorphous layer 1004 is left between the fronts 1005 and 1006. Annealing in this mode is performed at the step 703. There two types of species that can be used in an inventive process. One type comprises chemically active to silicon species (C, N, O, F, Cl, Br) and another type comprises noble gas species (Ne, Ar, Kr, Xe). Even though microscopic phenomena that proceeds under solid state epitaxy of these two types of impurities are different, all these impurities finally allows to obtain a thin trapping layer for hydrogen 1004, that is useful for further fabricating of high quality SOI wafers. Temperatures over about 650° C. in step 703 are not desirable, as it results in complete epitaxial regrowth of amorphized layer 1002. The layer 1004 obtained after the step 704 is also characterized by better roughness of the amorphous-crystalline interfaces 1005 and 1006 as compared to the interfaces in the as-implanted wafer before the step 703. This results in higher quality of the final SOI wafers.

At the next step 704, protium hydrogen is implanted into the wafer at a dose in a range $2 \times 10^{16}$ cm$^{-2}$ to $10^{17}$ cm$^{-2}$. This step is also illustrated by FIG. 9. An initial silicon wafer 901 with an oxide layer 902 is shown on FIG. 9A. The wafer is processes by step 702 by implanting specie 903. The wafer is further processed by step 703 resulting in a wafer with a trapping layer 904, FIG. 9B. FIG. 9C illustrates cases of inserting protium at different implantation energies. In an inventive process, the protium hydrogen implantation energy should be chosen to place hydrogen deeper, than the bottom interface 1005 of the confined buried amorphized layer 1004 FIG. 10. One skilled in the art can determine hydrogen implantation energy to satisfy an above condition using either tables of distribution of implanted ions or simulation programs mentioned above. The case of proper hydrogen implantation is illustrated on right side of FIG. 9C, 908. An opposite case is shown on the left side of the FIG. 9C, 907. The hydrogen is implanted at elevated temperature of about 350° C. to suppress trapping on protium-self-made defects (Smart-cut traps). For implantation in mode 908, most of hydrogen diffuses after stopping to an interface 1006 and collects there on trapping sites forming big number of small voids. Some hydrogen collects on the protium self-made defects and forms hydrogen bubbles 915 inside of a non-transferrable part of the wafer 901. For implantation in mode 907, most of hydrogen diffuses after stopping to an interface 1005 and collects there on trapping sites forming big number of small voids. Some hydrogen collects on the protium self-made defects and forms hydrogen bubbles 914 inside of a layer 905 to be transferred and become a working layer of SOI wafer 909.

Upon further steps of layer transfer, bonding FIG. 9D and cleavage FIG. 9E, the step 704 performed in mode 907 results in hydrogen microbubbles inside of the SOI active layer 912. After a final anneal of the SOI wafer 909, the hydrogen outdiffuses, and mictobubbles inside on the active layer 912 transforms into empty microvoids. Those microvoids are well known as the major type of defects in SOI wafers obtained by prior art layer transfer processes. If the step 704 performed in mode 908, it results in hydrogen microbubbles 917 inside of the leftover wafer SOI active layer 910. Therefore, the uncontrollably trapped hydrogen does appear in the active layer 912 of the final SOI wafer 909 and it does not result in defectness of the SOI wafers obtained by the inventive process. The confined buried amorphized layer 1004 has high capacity for trapping hydrogen. Therefore almost no hydrogen penetrates though the layer 1004 into a critical layer 1003; the layer 1004 serves here as a hydrogen-shielding layer. Therefore the inventive process provides a quality advantage over prior art processes if used for fabrication of SOI wafers.

Figure 1:
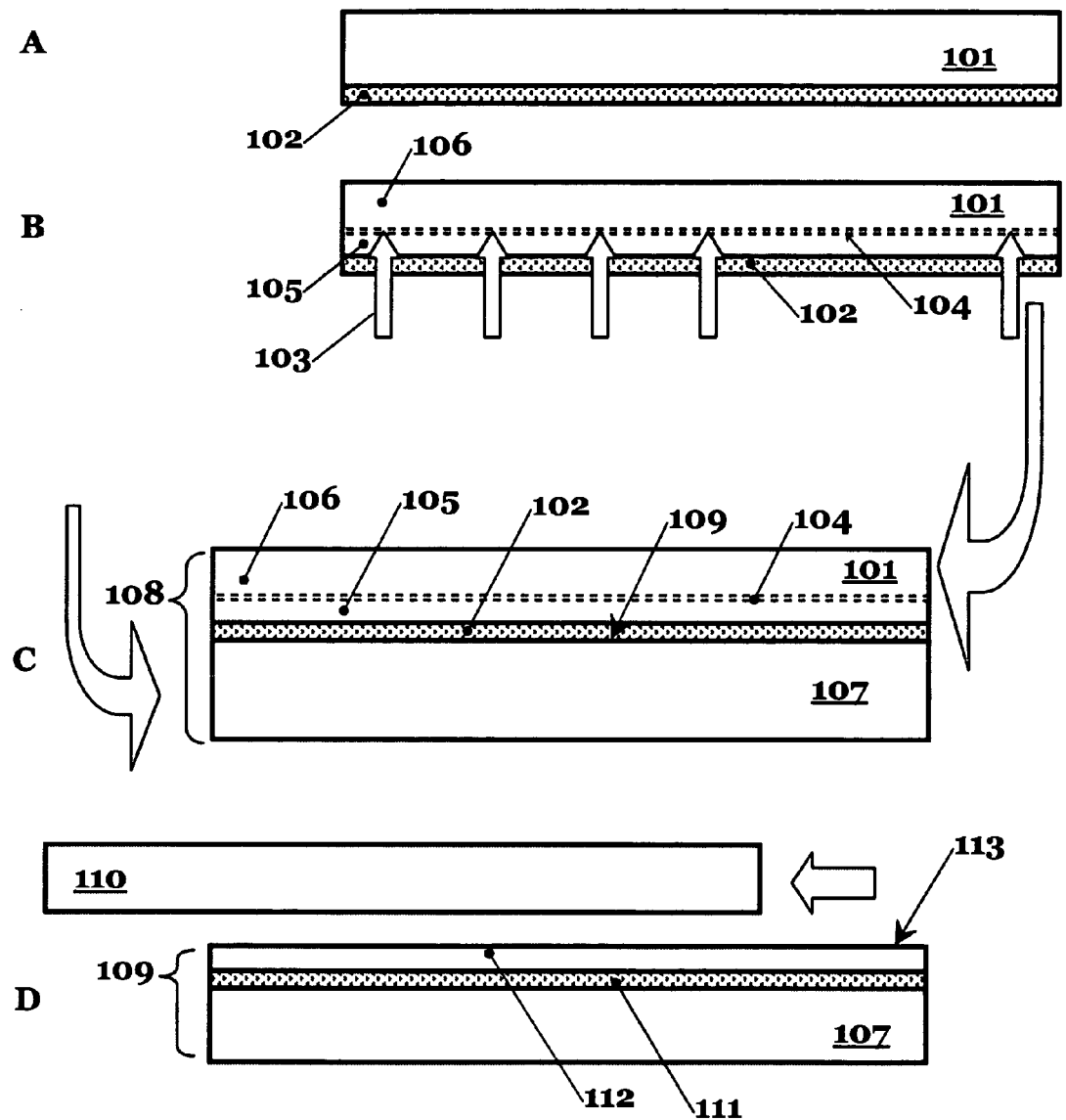
FIG. 1 is a schematic sequence of wafer cross sections illustrating a prior art Smart-Cut process.

At step 705 the hydrogen is further redistributed to maximize hydrogen content in a future cleavage plane and minimize hydrogen content in others wafer areas where it is typically detrimental and causes further quality issues. The step 705 is performed by annealing at temperatures in a range between 350 and 450° C. the hydrogen redistribution is enabled by detrapping of hydrogen from less thermally stable sites, diffusion, and retrapping onto higher thermally stable sites. At temperatures lower than 350° C., the detrapping is not enabled, and therefore the redistribution does not proceed. At temperatures exceeding 450° C. the wafer with a hydrogen containing wafer become unstable. Microcracks begin to form between the individual hydrogen bubbles, the wafer become unstable and it is under a risk of blistering. In prior art processes, a prebonded wafer assembly where subjected immediately to a cleavage anneal at about 550° C., 108 FIG. 1C. Therefore the wafer where subjected to a proper temperature during temperature ramping up of the cleavage step. However, as the ramping up is typically quite fast, no significant redistribution happens, resulting in additional quality issues in the final SOI wafers. In an inventive process the step 705 is included to solve that issue.

At step 706 the layer transfer is finalized similarly to the prior art processes.

DETAILED DESCRIPTION OF THE THIRD PREFERRED EMBODIMENT

This embodiment allows one to make a fragile layer inside of silicon to further fabricate SOI wafers with high throughput and high quality.

Figure 11:
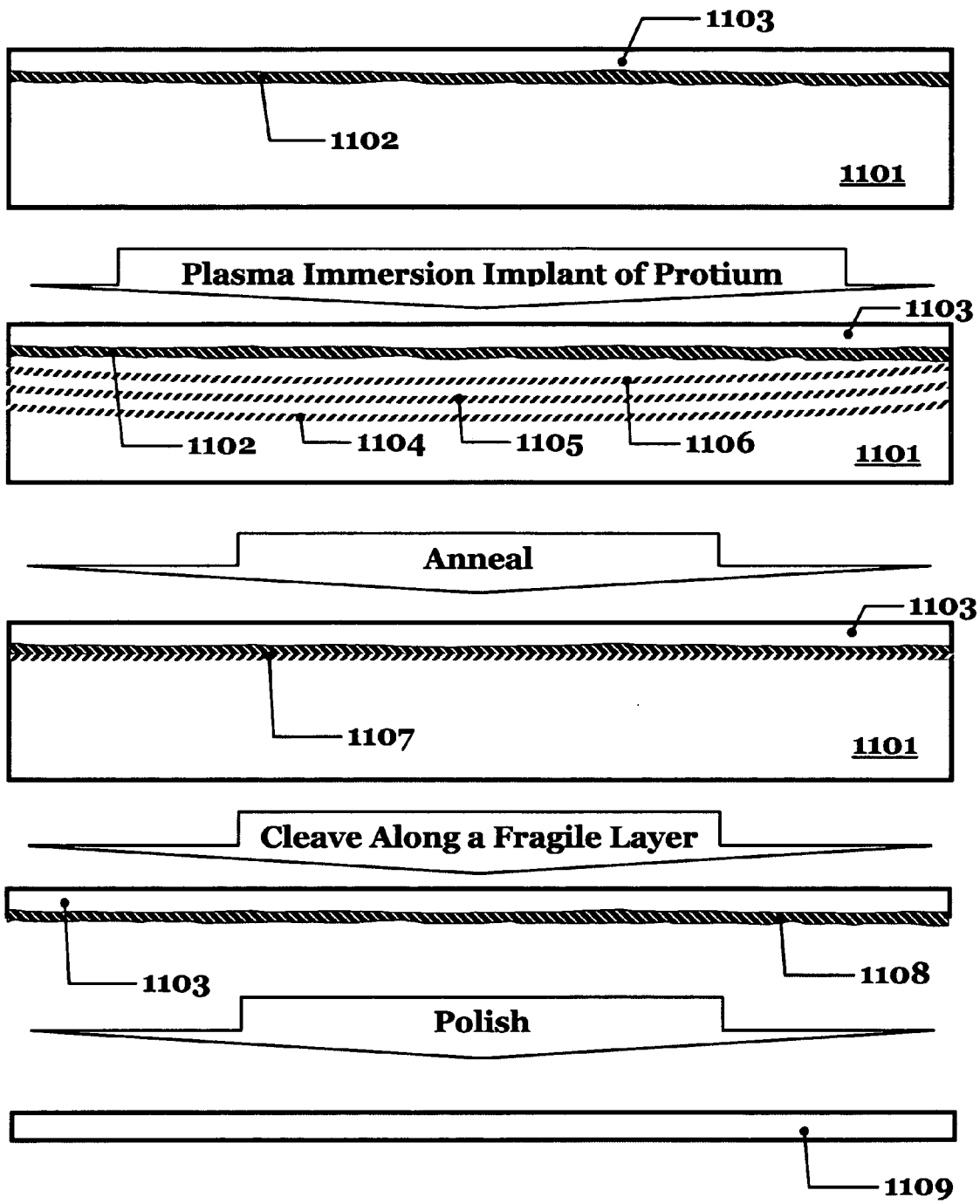
FIG. 11 illustrates hydrogen depth unifying after plasma immersion implantation of protium hydrogen due to the third preferred embodiment.

The process flow is illustrated by FIG. 11. A confined trapping layer 1102 for hydrogen is created inside of a wafer 1101 by either steps 402 and 403, or by steps 702 and 703 described in 1$^{st}$ and in 2$^{nd}$ preferred embodiments respectively. Further, protium hydrogen is inserted below the layer 1102 by plasma immersion ion implantation (PIII). The PIII was used in prior art processes to enable a layer transfer and further SOI fabrication. Several US patents where issued that relates to PIII for SOI: inventor Henley, and assignee Silicon Genesis. The Henley's process includes PIII into a non-trap-layer containing silicon wafer. That process results in very low quality SOI wafers, and therefore it is not used anymore in SOI wafer production. The PIII setup is essentially a simplified ion implanter: an implanter without a magnetic ion separator. All ion species created by an ion source are implanted into the target wafer in PIII. For hydrogen implantation, three main types of ions are created in an ion source and further implanted into the wafer: H$^+$, H$_2^+$, and H$_3^+$. When a molecular H$_2^+$ specie hits a target surface, it divided into two atomic hydrogen species each having ½ of initial energy. H$_3^+$ species also divide upon hitting of the target. Therefore, the hydrogen PIII results in three peaks of implanted hydrogen, 1104, 1105, and 1106 from H$^+$, H$_2^+$, and H$_3^+$ respectively. Further cleavage in the prior art Henley's process happens along the biggest from the 3 peaks. Henley's PIII had ECR ion source that provides about 90% of $H^+$, and the rest 10% were $H_2^+$, and $H_3^+$. Therefore, the Henley's process resulted in cleavage along the deepest peak 1004, and the supplemental peaks falls into the layer being transferred. Further the hydrogen from the supplemental peaks 1105 and 1106 resulted in microvoids inside of a superficial silicon film of SOI. Quality of the Henley's SOI was thus drastically diminished. Another issue was that PIII gives non uniform ion energies across the wafer that further translated into thicker transferred layer in wafer center as compared to the wafer periphery. In an inventive process, hydrogen is inserted with PIII into a heated wafer with a trapping layer 1102. Therefore, after stopping and forming 3 peaks, hydrogen diffuses, and most of hydrogen gets collected along a bottom side of the trapping layer 1107. In this embodiment, the PIII energy is chosen the way that the shallowest $H_3^+$ peak is still below the trapping layer 1102. The PIII is more cost effective implantation method that the regular beam implantation. Therefore an inventive process provides a cost-effective method of forming a fragile layer that further can be used for low cost fabrication of high quality SOI wafers. Under further cleavage and layer transfer, the inventive process due to current embodiment result transfer of a layer 1103 with thickness that is determined by a trap layer forming steps and independent on PIII conditions. The layer 1108 is further polished away, and a final SOI wafer contains a highly uniform superficial silicon film 1109 that is free from microvoids. If PIII is performed into a trap-layer-containing wafer with a $SiO_2$ film on top, the PIII-inserted hydrogen is shielded from the Si—SiO2 interface by the trapping layer 1102, resulting in high quality SOI without microvoids on the Si—$SiO_2$ interface.

Currently PIII production tools are available from major semiconductor equipment manufacturers: for example, PLAD machine manufactured by Varian Semiconductor Equipment Associates. All equipment needed for this embodiment is standard semiconductor equipment, and therefore high volume SOI wafer production can be performed using the inventive process.

PIII is also characterized in a wide range of ion energies. The PIII is pulsed process. It is controlled by applying a voltage pulse. The pulse is not ideal, it has a trapezoidal shape. During time when voltage rises from zero to a desired value, and during voltage dropping from a maximum value to zero, ion having energies from very low energy and to an energy determined by the maximum voltage in the pulse are implanted. Therefore, some amount of hydrogen is implanted into a layer 1103. If that layer contains defects, the defect will collect the hydrogen, and it further causes microvoids in the SOI film. To minimize this phenomenon, an upper part 1103 of the wafer 1101 should have minimum defect content. A main share of trapping-active defects in prime silicon wafers is due to oxygen contamination in the wafers. The oxygen contamination is a near-surface wafer areas can be significantly decreased by a specific annealing schedule creating a denuded zone that can extend by several microns from the wafer surface. Using of initial wafers with a denuded zone for SOI fabrication that includes an inventive process due to current embodiment results in the SOI results in high quality SOI having low concentration of microvoids in the superficial silicon layer.

I claim:

1. A method comprising:
(a) providing a single crystalline substrate
(b) forming a buried trapping layer inside of said substrate by ion implanting
(c) saturating said trapping layer with hydrogen
CHARACTERIZED IN THAT
(d) said trapping layer is confined after said ion implanting
(e) said saturating comprises redistribution of said hydrogen from as-implanted location to a location of said trapping layer
(f) implanting protium hydrogen at energy at which as-implanted depth exceeds a depth of said trapping layer
(g) said implanting of protium hydrogen into said substrate comprises implanting at elevated temperature.

2. The method of claim 1 wherein said substrate comprises a silicon single crystalline wafer.

3. The method of claim 1 wherein said forming a buried trapping layer comprises deuterium implanting at energy chosen in a range from 20 keV to 1 MeV and a dose from $2\times10^{15}$ to $10^{16}$ $cm^{-2}$.

4. The method of claim 3 wherein said confining of a buried trapping layer comprises annealing at temperature in a range at 300 to 400° C.

5. The method of claim 1 wherein said protium hydrogen implanting is provided to a dose in a range from $2\times10^{16}$ $cm^{-2}$ to $10^{17}$ $cm^{-2}$ at temperature around 350° C., and implantation energy is chosen from a condition that protium projection range exceeds a depth of maximum of displacements created by deuterium.

6. The method of claim 1 wherein said forming a buried trapping layer comprises implanting of a specie that is non-doping for silicon and that impedes silicon regrowth rate under solid state epitaxy at energy, dose, and temperature combination resulting in creation of a buried amorphized layer inside of said substrate.

7. The method of claim 6 wherein said specie is chosen from a set consisting of carbon, nitrogen, oxygen, fluorine, neon, chlorine, argon, bromine, krypton, and xenon at energy chosen in a range from 20 keV to 1 MeV and a dose from $2\times10^{14}$ to $2\times10^{15}$ $cm^{-2}$.

8. The method of claim 7 wherein said confining of a buried trapping layer comprises annealing at temperature that is higher than temperature enabling solid state epitaxy of low doped silicon, but lower than temperature enabling solid state epitaxy of high doped silicon.

9. The method of claim 8 wherein said confining of a buried trapping layer comprises annealing at temperature in a range at 500 to 600° C.

10. The method of claim 6 wherein said protium hydrogen implanting to a dose in a range from $2\times10^{16}$ $cm^{-2}$ to $10^{17}$ $cm^{-2}$ at temperature around 350° C. and protium implantation energy is chosen from a condition that protium projection range exceeds a depth of said buried trapping layer.

11. The method of claim 1 wherein said redistribution comprises annealing at temperature in a range 350 to 450° C.

12. The method of claim 1 wherein said protium hydrogen implanting is chosen from a set consisting from beam line implantation and plasma immersion implantation.

13. The method of claim 2 wherein said wafer has a denuded zone with a thickness exceeding a projection range of said implanted protium hydrogen.

* * * * *